(12) United States Patent
Wang et al.

(10) Patent No.: US 8,581,770 B2
(45) Date of Patent: Nov. 12, 2013

(54) ZERO-POWER SAMPLING SAR ADC CIRCUIT AND METHOD

(75) Inventors: Yan Wang, Tucson, AZ (US); Timothy V. Kalthoff, Tucson, AZ (US); Michael A. Wu, Audubon, PA (US)

(73) Assignee: Texas Instruments Incorporated, Dallas, TX (US)

( * ) Notice: Subject to any disclaimer, the term of this patent is extended or adjusted under 35 U.S.C. 154(b) by 141 days.

(21) Appl. No.: 13/068,192

(22) Filed: May 4, 2011

(65) Prior Publication Data

US 2012/0280841 A1 Nov. 8, 2012

(51) Int. Cl.
*H03M 1/12* (2006.01)

(52) U.S. Cl.
USPC ............ 341/172; 341/155; 341/144; 341/163

(58) Field of Classification Search
USPC .......................... 341/110, 172, 155, 144, 163
See application file for complete search history.

(56) References Cited

U.S. PATENT DOCUMENTS

| | | | | |
|---|---|---|---|---|
| 5,684,487 | A * | 11/1997 | Timko | 341/172 |
| 6,667,707 | B2 | 12/2003 | Mueck et al. | 341/172 |
| 7,432,844 | B2 * | 10/2008 | Mueck et al. | 341/163 |
| 7,812,757 | B1 | 10/2010 | Wong et al. | |
| 2003/0098808 | A1 * | 5/2003 | Hirai | 341/155 |
| 2006/0055577 | A1 | 3/2006 | Boemler | |
| 2007/0115159 | A1 * | 5/2007 | Tachibana et al. | 341/144 |
| 2008/0129573 | A1 * | 6/2008 | Mueck et al. | 341/163 |
| 2010/0026546 | A1 * | 2/2010 | Ohnhaeuser et al. | 341/172 |
| 2010/0194619 | A1 | 8/2010 | Onhaeuser et al. | |
| 2011/0057823 | A1 | 3/2011 | Harpe | |
| 2011/0260899 | A1 * | 10/2011 | Snedeker | 341/118 |

OTHER PUBLICATIONS

"Analog Integrated Circuit Design" by David Johns and Ken Martin, John Wiley & Sons, Inc., 1987, Figs. 13.5, 13.6 and 13.7.
PCT Search Report mailed Nov. 28, 2012.

* cited by examiner

*Primary Examiner* — Jean B Jeanglaude
(74) *Attorney, Agent, or Firm* — Alan A. R. Cooper; W. James Brady, III; Frederick J. Telecky, Jr.

(57) ABSTRACT

A switched-capacitor circuit (10, 32 or 32A) samples a first signal ($V_{IN}^+$) onto a first capacitor (C1 or $C_{IN1}$) by switching a top plate thereof via a summing conductor (13) to a first reference voltage ($V_{SS}$) and switching a bottom plate thereof to the first signal. A second signal ($V_{IN}^-$) is sampled onto a second capacitor (C3 or $C_{IN3}$) by switching a top plate thereof to the second signal and switching a bottom plate thereof to the first reference voltage. After the sampling, the top plate of the second capacitor is coupled to the top plate of the first capacitor. The bottom plate of the second capacitor is coupled to the first reference voltage. The bottom plate of the first capacitor is coupled to a second reference voltage ($V_{DD}$ or $V_{REF}$), to thereby cancel at least a portion of a common mode input voltage component from the first conductor (13), hold the sampled differential charge on the summing conductor and establish a predetermined common mode voltage thereon, and prevent the summing conductor from having a voltage which allows the leakage of charge therefrom. The switched-capacitor circuit may be a SAR, an integrator, or an amplifier.

22 Claims, 8 Drawing Sheets

US 8,581,770 B2

ZERO-POWER SAMPLING SAR ADC CIRCUIT AND METHOD

BACKGROUND OF THE INVENTION

The present invention relates generally to switched capacitor circuits, including SAR ADCs (successive approximation register analog to digital converters), and more particularly to an improved technique for avoiding charge leakage through integrated circuit substrate diodes caused by analog summing node voltages swinging outside of an acceptable range in a switched capacitor circuit, an SAR ADC, and still more particularly to SAR ADCs that are simpler and less expensive than those available in the prior art.

Prior Art FIG. 1A is a simplified diagram of a basic well-known single-ended SAR ADC which executes a conventional SAR algorithm to convert an analog input voltage $V_{IN}$ to a digital output signal $D_{OUT}$. For example, see FIGS. 13.5, 13.6, and 13.7 and associated text in "Analog Integrated Circuit Design" by David Johns and Ken Martin (1997 John Wiley & Sons, Inc.).

The SAR ADC in Prior Art FIG. 1A includes a sample/hold circuit 19 that receives input voltage $V_{IN}$. The output of sample/hold circuit 19 is applied to the (+) input of a comparator 20. The output 23 of comparator 20 is applied to an input of SAR/control logic circuitry 21 which controls operation of a basic SAR algorithm to sequentially generate N bits b1, b2 ... bN. The N bits b1, b2 ... bN control DAC 16 so as to cause its output voltage $V_{DAC}$ to be precisely equal to $V_{IN}$. At the end of the analog to digital conversion process, SAR/control logic 21 generates an "End of Conversion" signal EOC, and the N bits b1, b2 ... bN may be taken as the digital output signal $D_{OUT}$ into which $V_{IN}$ has been converted.

The output of sample/hold circuit 19 is compared with $V_{DAC}$ by comparator 20. The output of comparator 20 causes SAR/control logic 21 to determine, in accordance with a SAR algorithm, the values of bits b1, b2, ... bN in such a way as to cause DAC 16 to force the value of $V_{DAC}$ on conductor 13 to become closer and closer to the value of $V_{IN}$ as the SAR conversion cycle progresses. The basic SAR conversion process begins after completion of the sample and hold operation. First, bit b1 is set to "1", and the other bits b2, b3 ... bN are set to "0"s. DAC 16 generates a mid-level "half-voltage" equal to a value $V_{REF}/2$ with which the sampled input signal $V_{IN}$ is compared, where $V_{REF}$ represents the full-scale value of $V_{IN}$. Comparator 20 causes the final value of bit b1 to be set to a "1" if $V_{IN}$ is greater than $V_{DAC}$ but otherwise b1 is set to a "0", and in either case the remaining bits b2, b3 ... bN are set to "0"s. In the next conversion cycle, the SAR algorithm causes comparator 20 to test bit b2 in the same manner. DAC 16 generates an adjusted value of $V_{DAC}$ to which the sampled input signal $V_{IN}$ is compared. Comparator 20 causes the final value of bit b2 to be set to a "1" if $V_{IN}$ is greater than $V_{DAC}$ but otherwise b2 is set to a "0", and in either case the remaining bits b3, b4 ... bN are set to "0"s. Essentially the same procedure is repeated during each of the remaining bits cycles for each of the remaining bits b3, b4 ... bN, respectively.

The closest prior art is believed to include U.S. Pat. No. 6,667,707 entitled "Analog-to-Digital Converter with the Ability to Asynchronously Sample Signals without Bias or Reference Voltage Power Consumption" issued Dec. 23, 2003 to Mueck et al., and incorporated herein by reference. Prior Art FIG. 1B herein is essentially the same as FIG. 4 of the Mueck et al. patent, and shows an improved differential CDAC implementation of the SAR ADC of Prior Art FIG. 1A.

In Prior Art FIG. 1B, a differential input charge redistribution SAR ADC system 300 samples a pair of input voltages, Vinp and Vinn, with respect to a common mode bias voltage, Vcm. Under the control of a SAR algorithm/engine, a sequence of binary decisions is produced at the output OUT which correspond to the digital equivalent of Vrefp-Vrefn. ADC system 300 includes two DACs, DAC-P and DAC-N, a comparator 32, and an SAR engine (not shown) to drive the DACs. Note that the CDAC arrays perform the sample/hold function of sample/hold circuit 19 in Prior Art FIG. 1A, in addition to being used for the bit decision "feedback" function of providing CDAC output voltages at the comparator inputs in response to the input voltages. In this example, each DAC comprises a 6-bit binary-weighted capacitor array 34P, 34N, where the total capacitance of each array 34P, 34N is C. The DACs further include two corresponding sets 36P, 36N of switches to connect the respective DAC inputs to Vinp/n, and corresponding sets 38P, 38N of switches to connect the respective DAC inputs to Vrefp/n, and further include switches 20P, 20N to connect the DAC outputs, TOP-P, TOP-N, to Vcm. Each of the weighted capacitor arrays 34N associated with DAC-N and 34P associated with DAC-P includes capacitors C1, C2, C3, C4, C5, C6 and C7 having capacitances of C1=C/2, C2=C/4, C3=C/8, C4=C/16, C5=C/32, C6=C/64 and C7=C/64, the sum of which is approximately equal to C. Each of switch sets 36N associated with DAC-N and 36P associated with DAC-P includes switches S1, S2, S3, S4, S5 and S6. Each of switch groups 38N associated with DAC-N and 38P associated with DAC-P includes switches S21, S22, S23, S24, S25 and S26. The DAC outputs TOP-P, TOP-N, provide input voltages to comparator 32. The plates of the capacitors directly connected to TOP-P, TOP-N are referred to as "top plates", and the other capacitor plates are referred to as the "bottom plates." The switches to Vcm are referred to as the "top-plate switches" 20P and 20N.

During operation, an input voltage is sampled as charge across the input capacitors. With the DAC bottom plates connected to the input voltage Vinp and Vinn through switches and 36P 36N when the top-plate switches 20P and 20N are closed, the DAC is said to be "sampling the input", and the instant at which the top plate switches open, the DAC is said to have "taken the sample". After sampling the input voltage, the SAR ADC 300 carries out an iterative SAR process. Using the P-side of the circuit as an example, the SAR iterative process begins by connecting the bottom plate of each of the capacitor array 34P capacitors C1 ... C6, through its corresponding switch S1 ... S6 in switch bank 36P and a corresponding switch S21 ... S26 in switch bank 38P, to either the positive reference voltage Vrefp or the negative reference voltage Vrefn. Each capacitor, e.g. C4, represents one of the bits in the digital output word of the ADC 300, the most significant bit (MSB) of which corresponds to capacitor C1 and the least significant bit (LSB) of which corresponds to capacitor C6.

In Prior Art FIG. 1B, a bit has a binary value of 1 when the bottom plate of the associated capacitor, e.g. C4, is connected to the positive reference voltage Vrefp and the bit has a binary value of 0 when the bottom plate of the capacitor, e.g. C4, is connected to the negative reference voltage Vrefn through switch bank 38. In this example, switch S4 would get switched to connect capacitor C4 to the Vref set and switch S24 would get aligned to connect capacitor C4 to either Vrefp or Vrefn, depending on whether C4 was to represent a logical 1 or 0, respectively. Through such a series of SAR iterations, starting with the MSB capacitor and ending with the LSB capacitor, during each iteration each capacitor is switched to either Vrefp or Vrefn such that the top plate voltages TOP-P and TOP-N converge with each iteration. When the iterations have completed, the last-used digital word (the value of the bits to which the capacitors were connected) is selected as the output of the ADC 300.

The DAC top plates are sampled to Vcm, which is an arbitrary but constant voltage and which can be $V_{SS}$ for zero-power sampling. During sampling, TOP-P and TOP-N will be nominally held at approximately Vcm by the top plate switches.

In Prior Art FIG. 1B, after sampling the input voltage but prior to beginning the SAR process, the comparator output directs the SAR algorithm to modify the DAC inputs such that the two DAC outputs converge. The common mode output voltage of the DACs is boosted during only some of the iterations. The inputs to the comparator are capacitively boosted by coupling the common mode voltage boost to the comparator inputs during some of the iterations to thereby avoid associated leakage of sampled charge through the substrate diodes. However, as the SAR process progresses, the voltage differences between TOP-P and TOP-N become less and less, to a point where the voltage on an output node of a DAC no longer can turn on a substrate diode, and then the capacitive boost to the comparator inputs is removed.

For conventional Zero-Power Sampling SAR ADCs such as the one shown in Prior Art FIG. 1B, the summing node voltages at CDAC top plate can swing far beyond either the supply or the ground voltage. In SAR ADC 300 of Prior Art FIG. 1B, this causes leakage of the re-distributed charge from the CDAC capacitors to discharge through substrate diodes associated with the top-plate switches, thereby causing conversion errors. In Prior Art FIG. 1B, two switches are connected to Vcm at the inputs of comparator 32. Boosting capacitors 311P and 311N and associated additional circuitry, including switches 313P and 313N, are required to keep the summing node voltages at the inputs of comparator 32 within an acceptable range by boosting/shifting the summing node voltages from unacceptable out-of-range values to acceptable values, i.e., values which are no more than approximately 100 mV below $V_{SS}$, to prevent junction leakage into the substrate. Also, the conventional SAR algorithm is modified in order to accommodate the boosting/shifting operation by operatively connecting the boost capacitors for a number of initial bit cycles and then operatively disconnecting the boost capacitors. The summing node voltages must be monitored and controlled to keep the common mode voltages of the summing nodes within an acceptable range.

Thus, there is an unmet need for a switched-capacitor circuit and method which provide a fixed common mode voltage component on a summing conductor, the voltage of which otherwise would exceed a safe operating voltage range during normal operation.

There also is an unmet need for a SAR ADC and method which do not require boosting of analog summing voltages at the input of the comparator to prevent leakage from the analog summing nodes through substrate diodes of an integrated circuit due to out-of-range values of the analog summing voltages.

There also is an unmet need for a SAR ADC and method which do not require boosting of analog summing voltages at the input of the comparator to prevent leakage from the analog summing nodes through substrate diodes of an integrated circuit due to out-of-range values of the analog summing voltages and which are simpler and less costly than the closest prior art SAR ADCs.

There also is an unmet need for a SAR ADC and method which do not require boosting of analog summing voltages at the input of the comparator to prevent leakage from the analog summing nodes through substrate diodes of an integrated circuit due to out-of-range values of the analog summing voltages and which do not require modification of the normal SAR ADC decision process.

There also is an unmet need for a SAR ADC and method which avoids the reduced SNR (signal to noise ratio) associated with the use of capacitor boosting of analog summing voltages at the input of a comparator in the prior art in order to prevent leakage from the analog summing nodes substrate diodes.

There also is an unmet need to avoid the need to provide special circuitry for monitoring and controlling a common mode voltage of a summing conductor of a circuit such as an ADC, a switched capacitor filter, a switched capacitor integrator, or a switched capacitor amplifier.

SUMMARY OF THE INVENTION

It is an object of the invention to provide a switched-capacitor circuit and method which provide a predetermined common mode voltage component on a summing conductor, the voltage of which otherwise would exceed a safe operating voltage range during normal operation.

It is another object of this invention to provide a switched capacitor circuit which can accommodate a wide range of input common-mode voltages without requiring boosting the voltage of any conductor during operation to prevent the voltage of the conductor from exceeding a safe operating range.

It is another object of the invention to provide a ADC and method which do not require boosting of an analog summing voltage at the input of a comparator thereof to prevent leakage from an analog summing node through a substrate diode or other parasitic leakage path (such as a MOS transistor) of an integrated circuit due to out-of-range values of the analog summing voltage.

It is another object of the invention to provide a SAR ADC and method which do not require boosting of analog summing voltages at the input of the comparator to prevent leakage from the analog summing nodes through substrate diodes of an integrated circuit due to out-of-range values of the analog summing voltages and which are simpler and less costly than the closest prior art SAR ADCs.

It is another object of the invention to provide a zero-power sampling method for an ADC so as to achieve optimum common-mode voltage at the comparator input irrespective of the common-mode voltage of the analog input signal applied to the ADC.

It is another object of the invention to provide a SAR ADC and method which do not require boosting of analog summing voltages at the input of the comparator to prevent leakage from the analog summing nodes through substrate diodes of an integrated circuit due to out-of-range values of the analog summing voltages and which do not require modification of the normal SAR ADC decision process.

It is another object of the invention to provide a SAR ADC and method which avoid the reduced SNR (signal to noise ratio) associated with the use of capacitor boosting of analog summing voltages at the input of the comparator in the prior art in order to prevent leakage from the analog summing nodes to through substrate diodes.

It is another object of the invention to avoid the need to provide special circuitry as required in the prior art to monitor and control a common mode voltage of a summing conductor to keep the common mode voltage within an acceptable range.

Briefly described, and in accordance with one embodiment, the present invention provides a switched-capacitor circuit (10, 32 or 32A) which samples a first signal ($V_{IN}{}^+$) onto a first capacitor (C1 or $C_{IN1}$) by switching a top plate thereof via a summing conductor (13) to a first reference voltage ($V_{SS}$) and switching a bottom plate thereof to the first signal. A second signal ($V_{IN}{}^-$) is sampled onto a second capacitor (C3 or $C_{IN3}$) by switching a top plate thereof to the second signal and switching a bottom plate thereof to the first reference voltage. After the sampling, the top plate of the second capacitor is coupled to the top plate of the first capacitor. The bottom plate of the second capacitor is coupled to the first reference voltage. The bottom plate of the first capacitor is coupled to a second reference voltage ($V_{DD}$ or $V_{REF}$), to thereby cancel at least a portion of a common mode input voltage component from the first conductor (13), hold the sampled differential charge on the summing conductor and establish a predetermined common mode voltage thereon, and prevent the summing conductor from having a voltage which allows the leakage of charge therefrom.

In one embodiment, the invention provides a switched-capacitor circuit (10, 32 or 32A) including a first stage (16 or 33) that receives first ($V_{IN}{}^+$) and second ($V_{IN}{}^-$) input signals and includes first ($C_{IN1}$), second ($C_{IN2}$), third ($C_{IN3}$), and fourth ($C_{IN4}$) input capacitors and also includes a first arrangement of switches configured during a first phase to (1) couple the first input signal ($V_{IN}{}^+$) to a bottom plate of the first input capacitor ($C_{IN1}$) and a top plate of the fourth input capacitor ($C_{IN4}$), (2) couple the second input signal ($V_{IN}{}^-$) to a bottom plate of the second input capacitor ($C_{IN2}$) and a top plate of the third input capacitor ($C_{IN3}$), and (3) couple top plates of the first ($C_{IN1}$) and second ($C_{IN2}$) input capacitors to a first reference voltage ($V_{SS}$). Bottom plates of the third ($C_{IN3}$) and fourth ($C_{IN4}$) input capacitors are coupled to the first supply voltage ($V_{SS}$), the first ($V_{IN}{}^+$) and second ($V_{IN}{}^-$) input signals thereby being sampled during the first phase. The second stage (20 or 34) has first (13) and second (14) summing conductors coupled to the first stage (16 or 33) for processing a first summing conductor signal ($V_A{}^+$) and a second summing conductor signal ($V_A{}^-$) to produce first ($V_{OUT}{}^+$) and second ($V_{OUT}{}^-$) output signals. The first stage (32) also includes a second arrangement of switches configured during a second phase to couple the bottom plates of the first ($C_{IN1}$) and second ($C_{IN2}$) input capacitors to a second reference voltage ($V_{REF}$ or $V_{DD}$), to (1) couple the top plate of the first input capacitor ($C_{IN1}$) to the top plate of the third input capacitor ($C_{IN3}$), and (2) to couple the top plate of the second input capacitor ($C_{IN2}$) to the top plate of the fourth input capacitor ($C_{IN4}$) so as to cancel at least a portion of a common mode component associated with the first ($V_{IN}{}^+$) and second ($V_{IN}{}^-$) input signals from the first ($V_A{}^+$) and second ($V_A{}^-$) summing conductor signals and also establish a predetermined common mode voltage on the first (13) and second (14) summing conductors to thereby keep the first ($V_A{}^+$) and second ($V_A{}^-$) summing conductor signals within a predetermined safe operating range as charge associated with the first input signal ($V_{IN}{}^+$) is transferred from the first ($C_{IN1}$) and third ($C_{IN3}$) input capacitors to the first summing conductor (13) and as charge associated with the second input signal ($V_{IN}{}^-$) is transferred from the fourth ($C_{IN4}$) and second ($C_{IN2}$) input capacitors to the second summing conductor (14).

In one embodiment, the switched-capacitor circuit includes a SAR ADC (10) that includes a comparator (20) in the second stage (20 or 34) for comparing the first summing conductor signal ($V_A{}^-$) on the first summing conductor (13) and a second summing conductor signal ($V_A{}^+$) on the second summing conductor (14) during each of a number of bit testing operations. A first CDAC (16) in the first stage (16 or 33) includes a first group of binary weighted capacitors including a MSB capacitor (C3) and a plurality of LSB capacitors (C1=29-2, 3 . . . N, 26) each having a first terminal coupled to the first summing conductor (13), and a first group of switches (S1, 2 . . . N, $S_{DUMMY}$) for selectively coupling second terminals of corresponding capacitors of the first group to the first reference voltage ($V_{SS}$) or a second reference voltage ($V_{REF}$), the second terminals of the LSB capacitors of the first group being selectively coupled to the first input signal ($V_{IN}{}^+$) during a sampling operation. SAR and control circuitry (21 in FIG. 1) controls the switches (S1, 2 . . . N, $S_{DUMMY}$) of the first group in response to output signals (23,24) generated by the comparator (20). After the sampling operation is complete and before testing of a first bit (b1), the SAR and control circuitry (21) controls the switches (S1, 2 . . . N, $S_{DUMMY}$) of the first group to connect second terminals of the MSB capacitor (C3) and the LSB capacitors (C1=29-2,3 . . . N,26) of the first group in series between the first ($V_{SS}$) and second ($V_{REF}$) reference voltages to function as a capacitive voltage divider that generates the predetermined common mode voltage signal component ($V_{CM}$) on the first summing conductor (13). The common mode voltage signal component ($V_{CM}$) on the first summing conductor (13) has a voltage midway between the first ($V_{SS}$) and second ($V_{REF}$) reference voltages. In a described embodiment, the bit testing operations are performed in response to the comparator (20) and the SAR and control circuitry (21) in accordance with a SAR algorithm.

In one embodiment, first switch (SW5) couples the first summing conductor (13) to the first reference voltage ($V_{SS}$) during the sampling operation. The first CDAC (16) includes a second switch (SW3) which couples the first summing conductor (13) to the first terminal of the MSB capacitor (C3) during a charge holding operation after the sampling operation and before the testing of the first bit (b1).

In one embodiment, a second CDAC (17) includes a second group of binary weighted capacitors including a MSB capacitor (C2) and a plurality of LSB capacitors (C4=30-2, 3 . . . N, 27) each having a first terminal coupled to produce a second signal ($V_A{}^+$) on a second summing conductor (14) and a second group of switches (S1, 2 . . . N, $S_{DUMMY}$) for selectively coupling corresponding capacitors of the second group to the first reference voltage ($V_{SS}$) or the second reference voltage ($V_{REF}$). The second terminal of the LSB capacitors of the second group are coupled to a second input signal ($V_{IN}{}^-$) during the sampling operation. The first terminal of the MSB capacitor (C3) of the first group is coupled to receive the first input signal ($V_{IN}{}^-$) during the sampling operation, and the first terminal of the MSB capacitor (C2) of the second group is coupled to receive the second input signal ($V_{IN}{}^+$) during the sampling operation. The charge holding operation is performed by means of the MSB capacitor (C3) and the LSB capacitors (C1=29-2, 3 . . . N, 26) of the first group.

In one embodiment, the first switch (S1) of the first group couples the second terminal of the MSB capacitor (C3) of the first group to the first reference voltage ($V_{SS}$) during the sampling operation and other switches (S2, 3 . . . N, $S_{DUMMY}$) of the first group couple the second terminals of the LSB capacitors (C1=29-2, 3 . . . N, 26), respectively, of the first group to the first input signal ($V_{IN}{}^+$) during the sampling. The first switch (S1) of the first group couples the second terminal of the MSB capacitor (C3) to the first reference voltage ($V_{SS}$) during the charge holding operation and other switches (S2, 3 . . . N, $S_{DUMMY}$) of the first group couple the second terminals of the LSB capacitors (C1=29-2, 3 . . . N, 26), respectively, of the first group to the second reference voltage ($V_{REF}$) during the charge holding. The first ($VA^-$) and second ($VA^+$) signals remain between the first ($V_{SS}$) and second ($V_{REF}$) reference voltages during all bit testing operations and converge toward the predetermined common mode voltage signal component ($V_{CM}$) as the bit testing proceeds.

In one embodiment, the analog to digital converter is a fully differential analog to digital converter. In one embodiment, the switched capacitor circuit includes a switched-capacitor integrator circuit (32) that includes an integrator (35), a first integrating capacitor ($C_{INTA}$), and a second integrating capacitor ($C_{INTB}$) in the second stage (34). In another embodiment, the switched-capacitor circuit includes a switched-capacitor amplifier circuit (32A) that includes an amplifier (36) in the second stage (34A).

In one embodiment, the invention provides a method for preventing leakage of differential input charge which has been sampled from a differential input signal that is equal to the difference between a first input signal ($V_{IN}^+$) and a second input signal ($V_{IN}^-$). The method includes sampling the first input signal ($V_{IN}^+$) onto a first capacitor (C1 or $C_{IN1}$) by switching a first terminal (top plate) of the first capacitor (C1 or $C_{IN1}$) through a first conductor (13) to a first reference voltage ($V_{SS}$), and switching a second terminal (bottom plate) of the first capacitor (C1 or $C_{IN1}$) to the first input signal ($V_{IN}^+$); sampling the second input signal ($V_{IN}^-$) onto a second capacitor (C3 or $C_{IN3}$) by switching a first terminal (top plate) of the second capacitor (C3 or $C_{IN3}$) to the second input signal ($V_{IN}^-$) and switching a second terminal (bottom plate) of the second capacitor (C3 or $C_{IN3}$) to the first reference voltage ($V_{SS}$); after the sampling operation is complete, decoupling the first conductor (13) from the first reference voltage ($V_{SS}$); and switching the first terminal (top plate) of the second capacitor (C3 or $C_{IN3}$) to the first conductor (13) to couple the first terminal (top plate) of the second capacitor (C3 or $C_{IN3}$) to the first terminal (top plate) of the first capacitor (C1 or $C_{IN1}$), switching the second terminal (bottom plate) of the second capacitor (C3 or $C_{IN3}$) to the first reference voltage ($V_{SS}$), and switching the second terminal (bottom plate) of the first capacitor (C1 or $C_{IN1}$) to a second reference voltage ($V_{DD}$ or $V_{REF}$), to thereby cancel at least a portion of a common mode input voltage component from the first conductor (13), hold the sampled differential charge on the first conductor (13), establish a predetermined common mode voltage component on the first conductor (13), and also prevent the voltage of the first conductor (13) from having a value which allows the leakage to occur.

In one embodiment, the method includes converting the difference between the first input signal ($V_{IN}^+$) and the second input signal ($V_{IN}^-$) to a digital signal ($D_{OUT}$), In one embodiment, the method includes sampling the first input signal ($V_{IN}^+$) onto each of a first group of binary weighted LSB capacitors (C1=29-2, 3 ... N, 26) by switching first terminals (top plates) of the binary weighted LSB capacitors (C1=29-2, 3 ... N, 26) of the first group through a first summing conductor (13) to a first reference voltage ($V_{SS}$), and switching second terminals (bottom plates) of the binary weighted LSB capacitors (C1=29-2, 3 ... N, 26) of the first group to the first input signal ($V_{IN}^+$), wherein the first group of binary weighted LSB capacitors (C1=29-2, 3 ... N, 26) is included in the first capacitor (C1); switching a second terminal (bottom plate) of a first MSB capacitor (C3) to the first reference voltage ($V_{SS}$) and switching a first terminal (top plate) of the first MSB capacitor (C3) to the second input signal ($V_{IN}^-$), wherein the first MSB capacitor (C3) is included in the second capacitor (C3), the first conductor (13) being connected to a first input (−) of a comparator (20); decoupling the first conductor (13) from the first reference voltage ($V_{SS}$) before testing of a first bit (b1); and switching the first terminal (top plate) of the first MSB capacitor (C3) to the first conductor (13) to thereby couple the first terminal (top plate) of the first MSB capacitor (C3) to the first terminals (top plates) of the binary weighted LSB capacitors (C1=29-2,3 ... N,26) of the first group, switching the second terminal (bottom plate) of the first MSB capacitor (C3) to the first reference voltage ($V_{SS}$), and switching the second terminals (bottom plates) of the first group of LSB capacitors (C1=29-2, 3 ... N, 26) to a second reference voltage ($V_{REF}$); and producing the digital signal ($D_{OUT}$) by operating the comparator (20) and various switches in accordance with a SAR algorithm to test and set successive bits of the digital signal ($D_{OUT}$) that correspond, respectively, to the first MSB capacitor (C3) and the first group of LSB capacitors (C1=29-2, 3 ... N, 26).

In one embodiment, the method includes coupling a second input (+) of the comparator (20) to a reference voltage that is midway between the first ($V_{SS}$) and second ($V_{REF}$) reference voltages.

In one embodiment, the method includes sampling the second input signal ($V_{IN}^-$) onto a first terminal (top plate) of each of a second group of binary weighted LSB capacitors (C4=30-2, 3 ... N, 27) by switching first terminals of the binary weighted LSB capacitors (C4=30-2, 3 ... N, 27) of the second group through a second conductor (14) to the first reference voltage ($V_{SS}$), and switching second terminals (bottom plates) of the binary weighted LSB capacitors (C4=30-2, 3 ... N, 27) of the second group to the second input signal ($V_{IN}^-$), and wherein the method also includes sampling the first input signal ($V_{IN}^+$) onto a second terminal (bottom plate) of a second MSB capacitor (C2) by switching a first terminal (top plate) of the second MSB capacitor (C2) to the first input signal ($V_{IN}^+$), and switching a second terminal (bottom plate) of the second MSB capacitor (C2) to the first reference voltage ($V_{SS}$); and switching the second terminals (bottom plates) of the second group of LSB capacitors (C4=30-2, 3 ... N, 27) to the first reference voltage ($V_{SS}$), switching the first terminal (top plate) of the second MSB capacitor (C2) to the second conductor (14) and switching the second terminal (bottom plate) of the second MSB capacitor (C2) to the second reference voltage ($V_{REF}$).

In one embodiment, the method includes operating the first MSB capacitor (C3) and the first group of LSB capacitors (C1=29-2, 3 ... N, 26) as a capacitive voltage divider to generate a fixed common mode voltage signal component ($V_{REF}/2$) on the first summing conductor (13). In a described embodiment, a dummy capacitor (26) having the same capacitance as the least significant of the LSB capacitors (29-N) is provided.

In one embodiment, the invention provides a switched-capacitor circuit (10, 32 or 32A) for converting a difference between a first input signal ($V_{IN}^+$) and a second input signal ($V_{IN}^-$) to a digital signal ($D_{OUT}$) so as to prevent leakage of sampled input charge through an integrated circuit substrate diode (25), including means (21 in FIG. 1A and 16 in FIG. 2 or 33 in FIG. 9) for sampling the first input signal ($V_{IN}^+$) onto a first capacitor (C1 or $C_{IN1}$) by switching a first terminal (top plate) of the first capacitor (C1 or $C_{IN1}$) through a first conductor (13) to a first reference voltage ($V_{SS}$), and switching a second terminal (bottom plate) of the first capacitor (C1 or $C_{IN1}$) to the first input signal ($V_{IN}^+$); means (21 in FIG. 1A and 16 in FIG. 2 or 33 in FIG. 9) for sampling the second input signal ($V_{IN}^-$) onto a second capacitor (C3 or $C_{IN3}$) by switching a first terminal (top plate) of the second capacitor (C3 or $C_{IN3}$) to the second input signal ($V_{IN}^-$) and switching a second terminal (bottom plate) of the second capacitor (C3 or $C_{IN3}$) to the first reference voltage ($V_{SS}$); and means (SW3 in FIG. 2 or S3A,B in FIG. 9) for coupling the first terminal (top plate) of the second capacitor (C3 or $C_{IN3}$) to the first conductor (13) to couple the first terminal (top plate) of the second capacitor (C3 or $C_{IN3}$) to the first terminal (top plate) of the first capacitor (C1 or $C_{IN1}$), coupling the second terminal (bottom plate) of the second capacitor (C3 or $C_{IN3}$) to the first reference voltage ($V_{SS}$), and coupling the second terminal (bottom plate) of the first capacitor (C1 or $C_{IN1}$) to a second reference voltage ($V_{DD}$ or $V_{REF}$), to thereby cancel at least a portion of a common mode input voltage component from the first conductor (13), hold the sampled differential charge on the first conductor (13), establish a predetermined common mode voltage component on the first conductor (13), and prevent the voltage of the first conductor (13) from having a value which allows the leakage to occur.

DETAILED DESCRIPTION OF THE PREFERRED EMBODIMENTS

Figure 1A:
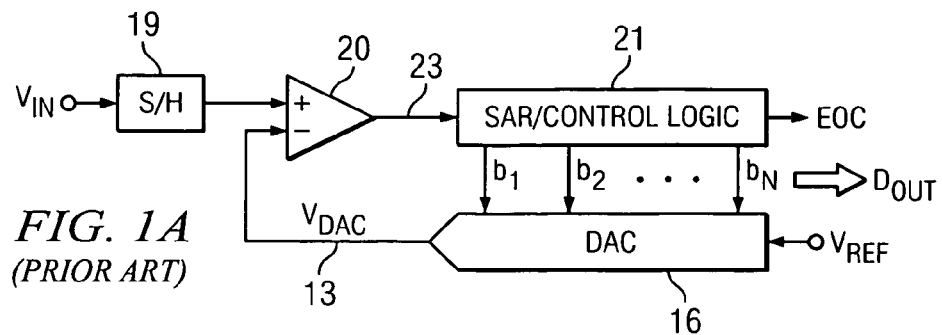
FIG. 1A is a block diagram of a basic prior art SAR ADC.
Figure 1B:
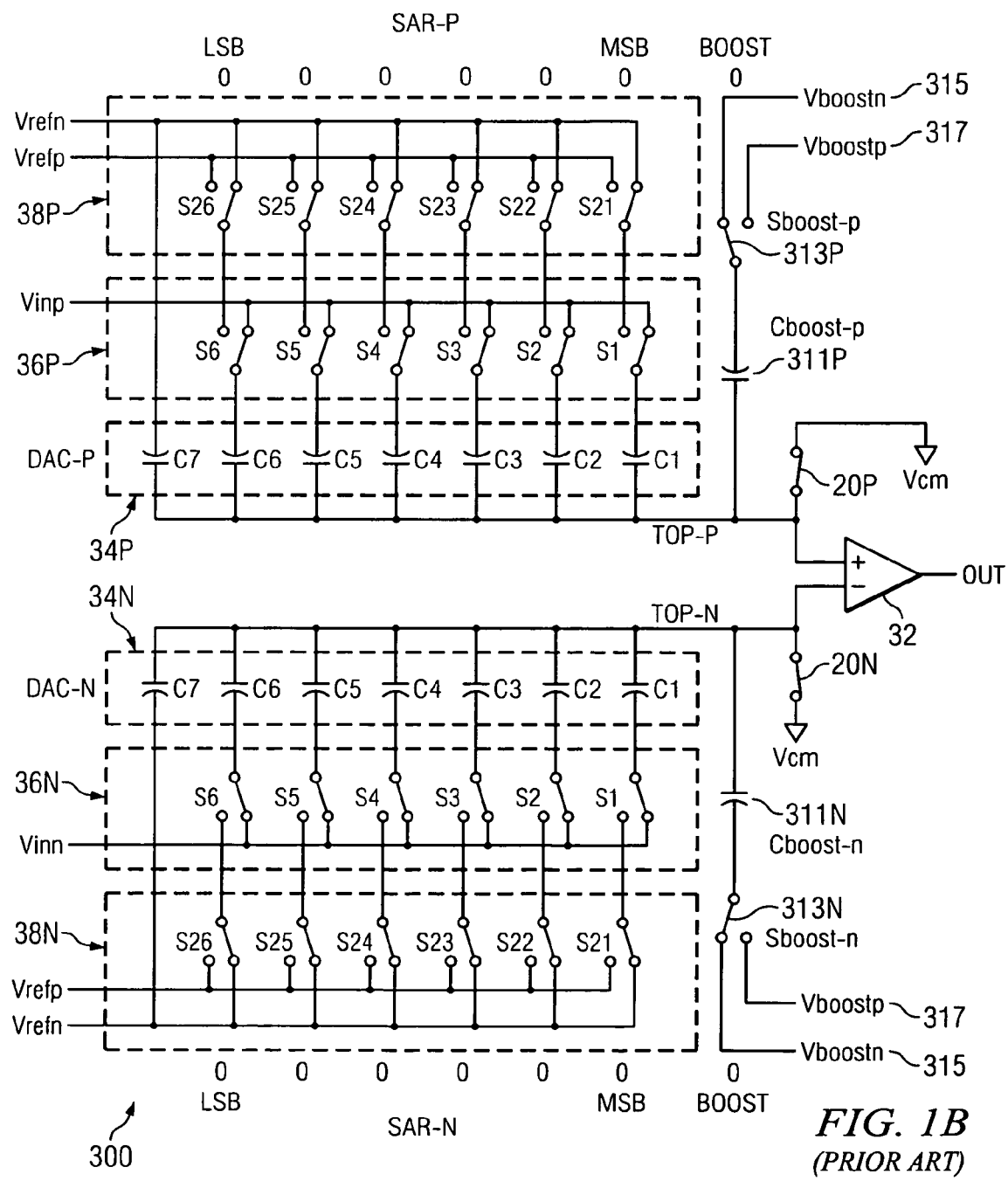
FIG. 1B is a schematic diagram of a differential CDAC implementation of a prior art SAR ADC.
Figure 2:
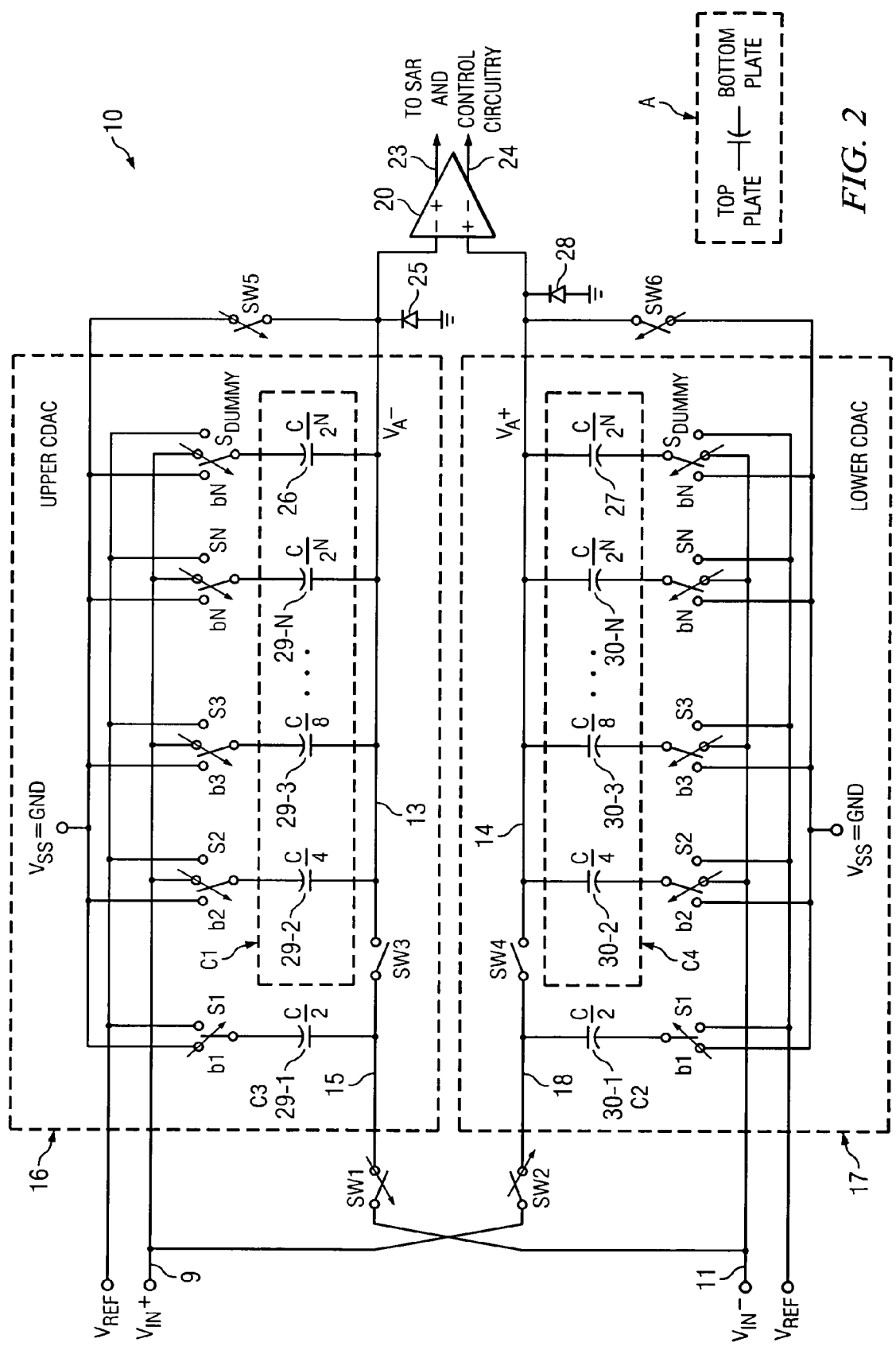
FIG. 2 is a schematic diagram of an SAR ADC having switches configured for sampling a differential input voltage.

Referring to FIG. 2, SAR ADC 10 includes an upper CDAC (capacitor digital to analog converter) 16, a lower CDAC 17, and a conventional comparator 20. SAR ADC 10 also includes conventional SAR and control logic circuitry, such as SAR/control logic 21 shown in Prior Art FIG. 1. A differential analog input voltage $V_{IN}^+-V_{IN}^-$ is applied between input conductors 9 and 11.

Upper CDAC 16 includes N binary weighted capacitors 29-1, 2 ... N, a dummy capacitor 26, N switches S1, S2 ... SN, and a dummy switch $S_{DUMMY}$. (In one implementation, N is equal to 16 (or equivalent to 16, for example, if conventional scaling capacitors are used). Capacitor 29-1 is the MSB capacitor of upper CDAC 16, and has its "top plate" connected to conductor 15 and its "bottom plate" connected to the pole terminal of switch S1. (Note the symbol "A" shown in FIG. 2 for a CDAC capacitor indicating which plate is the "top plate" and which plate is the "bottom plate".) The remaining capacitors 29-2, 3 ... N of upper CDAC 16 are referred to as its "LSB capacitors", and each has a top plate connected to a first summing conductor 13 which conducts an analog voltage $V_A^-$ and is connected to the (−) input of SAR comparator 20. Capacitors 29-1, 2, 3 ... N in upper CDAC 16 have capacitances equal to C/2, C/4, ... $C/2^N$, respectively. Dummy capacitor 26 in upper CDAC 16 has the same capacitance $C/2^N$ as the least significant LSB capacitor 29-N. (The dummy LSB capacitor 26 is useful to keep the LSB errors of SAR ADC 10 within one half of a LSB value.) Summing conductor 13 is coupled by a substrate diode 25 to the substrate of an integrated circuit in which SAR ADC 10 is fabricated.

LSB capacitors 29-2, 3 ... N have bottom plates connected to the pole terminals of switches S1, 2 ... SN, respectively. The top plate of dummy capacitor 26 is coupled to summing conductor 13. The bottom plate of dummy capacitor 26 is connected to the pole terminal of switch $S_{DUMMY}$. A switch SW5 is connected between summing conductor 13 and $V_{SS}$. Conductor 15 is coupled by switch SW3 to upper summing conductor 13 and also is operatively connected by switch SW1 to input conductor 11. (It should be appreciated that dummy capacitor 26 and its associated switch $S_{DUMMY}$ may be optional. Furthermore, conventional scaling capacitors may be coupled in series between sections of the CDACs in order to reduce the sizes of some of the more highly weighted (MSB) capacitors.)

A first terminal of each of switches S1, 2 ... N is connected to the supply voltage $V_{SS}$, which typically is a ground voltage (GND). A second terminal of each of switches S1, 2 ... N is connected to a reference voltage $V_{REF}$. A third terminal of each of switches S2, 3 ... N is connected to conductor 9 to receive $V_{IN}^+$. First, second, and third terminals of dummy switch $S_{DUMMY}$ are connected to $V_{SS}$, $V_{REF}$, and $V_{IN}^+$, respectively.

Similarly, lower CDAC 17 includes N binary weighted capacitors 30-1, 2 ... N, a dummy capacitor 27, N switches S1, S2 ... SN, and a dummy switch $S_{DUMMY}$. Capacitor 30-1 is the MSB capacitor of lower CDAC 17, and has its top plate connected to conductor 18 and its bottom plate connected to the pole terminal of switch S1. The remaining capacitors 30-2, 3 ... N of lower CDAC 17 are referred to as its LSB capacitors, and each has a top plate connected to a second summing conductor 14 which conducts an analog voltage $V_A^+$ and is connected to the (+) input of comparator 20. Capacitors 30-1, 2 ... N in lower CDAC 17 have capacitances equal to C/2, C/4, ... $C/2^N$, respectively. Dummy capacitor 27 in lower CDAC 17 has a capacitance equal to $C/2^N$. Summing conductor 14 is coupled by a substrate diode 28 to the substrate of integrated circuit in which SAR ADC 10 is fabricated. LSB capacitors 30-2, 3 ... N of lower CDAC 17 have bottom plates connected to the pole terminals of switches S2, 3 ... SN, respectively. The top plate of dummy capacitor 27 is connected to summing conductor 14. The bottom plate of dummy capacitor 27 is connected to one terminal of switch $S_{DUMMY}$. A switch SW6 is connected between summing conductor 14 and supply voltage $V_{SS}$. Conductor 18 is coupled by switch SW4 to summing conductor 14 and also is operatively connected by switch SW2 to input conductor 9. A first terminal of each of switches S1,2 . . . N is connected to $V_{SS}$. A second terminal of each of switches S1, 2 . . . N is connected to reference voltage $V_{REF}$. A third terminal of each of switches S2, 3 . . . N is connected to conductor 11 to receive $V_{IN}^-$. First, second, and third terminals of dummy switch $S_{DUMMY}$ are connected to $V_{SS}$, $V_{REF}$, and $V_{IN}^-$, respectively.

The output conductors 23 and 24 of comparator 20 are coupled to inputs of SAR and control logic circuitry (which can be similar to SAR/control logic 21 shown in Prior Art FIG. 1) to generate N bit signals b1, b2, . . . bN to control switches S1, S2 . . . SN in both upper CDAC 16 and lower CDAC 17 during the SAR conversion process. Switches $S_{Dummy}$ also are controlled by bit signal bN. The logic levels of b1, b2, . . . bN at the end of the digital to analog conversion process form the digital output signal $D_{OUT}$ of SAR ADC 10. It should be noted that if either $V_A^+$ or $V_A^-$ go more than approximately 100 mV below $V_{SS}$/ground, integrated circuit substrate diodes (such as diodes 25 and 28 and FIG. 2) associated with switches SW3, SW5, and SW1 in upper CDAC 16 and switches SW4, SW6, and SW2 in lower CDAC 17 may become slightly forward biased and cause leakage of charge from summing conductors 13 and/or 14 that would result in conversion errors.

The open/closed configuration of the various switches in upper CDAC 16 and lower CDAC 17 shown in FIG. 2 is utilized during sampling of the input voltages $V_{IN}^+$ and $V_{IN}^-$, Specifically, during the input sampling operation switch S1 in upper CDAC 16 operatively connects the bottom plate of capacitor 29-1 to $V_{SS}$, and switches S2, 3 . . . N and $S_{DUMMY}$ connect the bottom plates of capacitors 29-2, 3 . . . N and 26 to $V_{IN}^+$. Similarly, during the input sampling operation switch S1 in lower CDAC 17 connects the bottom plate of capacitor 30-1 to $V_{SS}$, and switches S2,3 . . . N and $S_{DUMMY}$ connect the bottom plates of capacitors 30-2, 3 . . . N and 27 to $V_{IN}^+$. During sampling, switches SW1, SW2, SW5, and SW6 are closed and switches SW3 and SW4 are open.

Figure 3:
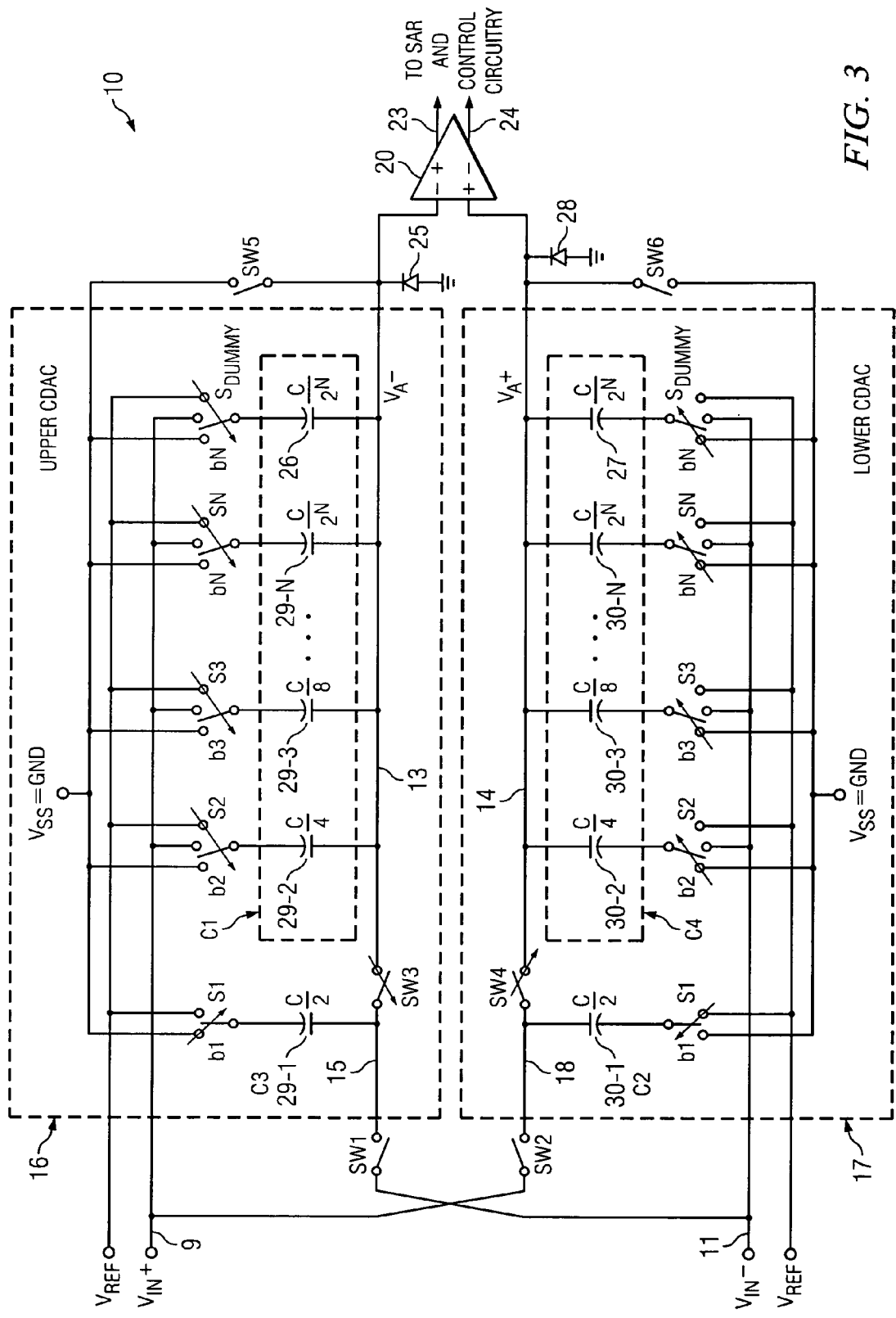
FIG. 3 is a schematic diagram of the SAR ADC of FIG. 2 having its switches configured for holding the sampled differential input voltage and converting it to digital representations thereof.

FIG. 3 shows a different open/closed configuration of the various switches in upper CDAC 16 and lower CDAC 17 which is used during the "holding" or storing of the charge associated with the input voltages $V_{IN}^+$ and $V_{IN}^-$ sampled during the sampling process illustrated in FIG. 2. Specifically, in upper CDAC 16, during the sampled charge holding operation, switch S1 operatively connects the bottom plate of capacitor 29-1 to $V_{SS}$, and switches S2,3 . . . N and $S_{DUMMY}$ operatively connect the bottom plates of capacitors 29-2, 3 . . . N and 26, respectively, to $V_{REF}$. During the sampled charge holding operation in lower CDAC 17, switch S1 operatively connects the bottom plate of capacitor 30-1 to $V_{REF}$, and switches S2, 3 . . . N and $S_{DUMMY}$ operatively connect the bottom plates of capacitors 30-2, 3 . . . N and 27, respectively, to $V_{SS}$. During the sampled charge holding operation, switches SW3 and SW4 are closed and switches SW1, SW2, SW5 and SW6 are open.

Figure 4:
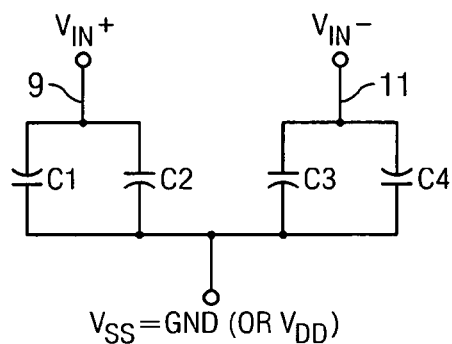
FIG. 4 is a simplified schematic diagram for illustrating and analyzing the zero-power sampling technique of the SAR ADC of FIGS. 2 and 3.

FIG. 4 shows a simplified equivalent circuit that represents the configurations of the switches and CDAC capacitors in upper CDAC 16 and lower CDAC 17 during the sampling operation as shown in FIG. 2. In FIG. 4 and subsequently described FIG. 5, capacitor C1 represents the combined capacitance of upper CDAC LSB capacitors 29-2, 3 . . . N and dummy capacitor 26. Capacitor C2 represents the lower CDAC MSB capacitor 30-1. Capacitor C3 represents the upper CDAC MSB capacitor 29-1, and capacitor C4 represents the combined capacitance of lower CDAC LSB capacitors 30-2, 3 . . . N and dummy capacitor 27. The capacitances of capacitors C1, C2, C3, and C4 are all assumed to be equal to C. (However, is not always essential that C1, C2, and C4 all be exactly equal to C; in some cases they may be only approximately equal to C.)

In FIG. 4, the top and bottom plates of capacitor C1 are connected to $V_{SS}$ and $V_{IN}^+$, respectively. The top and bottom plates of capacitor C2 are connected in the opposite order to $V_{IN}^+$ and $V_{SS}$, respectively. Similarly, the top and bottom plates of capacitor C4 are connected to $V_{SS}$ and $V_{IN}^-$, respectively, and the top and bottom plates of capacitor C3 are connected in the opposite order, to $V_{IN}^-$ and $V_{SS}$, respectively. (Alternatively, however, the top plates of capacitors C1 and C4 and the bottom plates of capacitors C2 and C3 may be connected to $V_{DD}$ instead of $V_{SS}$ or ground.)

Figure 5:
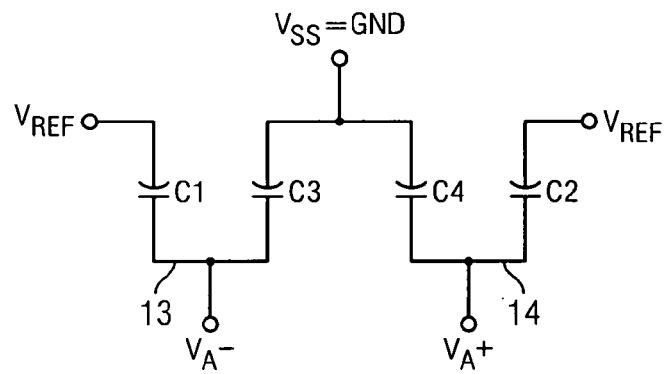
FIG. 5 is a simplified schematic diagram for illustrating and analyzing CDAC capacitor charges during conversion of the sampled and held differential input voltage for the SAR ADC of FIGS. 2 and 3.

FIG. 5 shows a simplified equivalent circuit that represents the configurations of the various switches and CDAC capacitors in upper CDAC 16 and lower CDAC 17 during the sampled charge holding that occurs immediately after the sampling illustrated in FIG. 2 is completed. Specifically, in FIG. 5 the top and bottom plates of capacitor C1 are connected to $V_A^-$ and $V_{REF}$, respectively. The top and bottom plates of capacitor C2 are connected to $V_A^+$ and $V_{REF}$, respectively. Similarly, the top and bottom plates of capacitor C3 are connected to $V_A^-$ and $V_{SS}$, respectively. The top and bottom plates of capacitor C4 are connected to $V_A^+$ and $V_{SS}$, respectively.

At this point, it may be helpful to refer to FIG. 6, which shows waveforms of the signals $V_{IN}^+$, $V_{IN}^-$, $V_{SIG}$, and the common mode input voltage component $V_{CM}$ that are used in the following Equations A, D and C and also in Equations (1) through (6).

Figure 6:
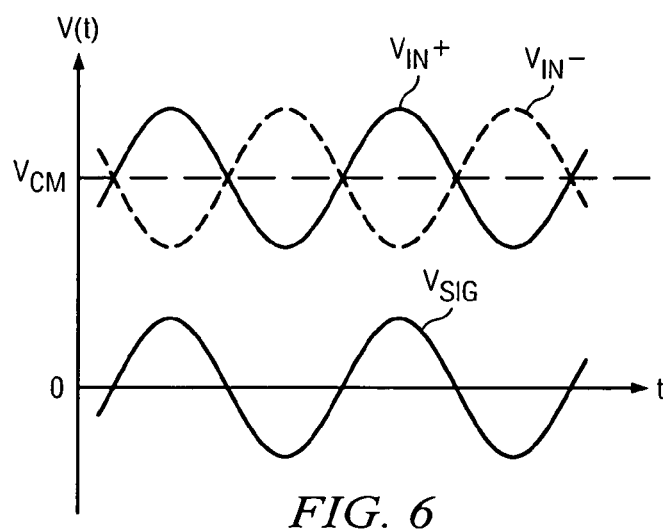
FIG. 6 is a graph illustrating the input voltage signals $V_{IN}^+$ and $V_{IN}^-$ in FIGS. 2 and 3, and also illustrating a voltage signal $V_{SIG}$ used in an analysis of the SAR ADC of FIGS. 2 and 3.

$V_{SIG}$ in FIG. 6 shows the AC component of input voltages $V_{IN}^+$ and $V_{IN}^-$, and also shows the common mode voltage component $V_{CM}$ of $V_{IN}^+$ and $V_{IN}^-$. The signal applied to the inputs of SAR ADC 10 includes both the differential input signal component $V_{IN}^+ - V_{IN}^-$ and the common mode input signal component $V_{CM}$, wherein $V_{IN}^+$ is equal to $V_{CM} + V_{SIG}$ and $V_{IN}^-$ is equal to $V_{CM} - V_{SIG}$. Averaging $V_{IN}^+$ and $V_{IN}^-$ yields the expression $(V_{IN}^+ + V_{IN}^-)/2$, which is the common mode signal $V_{CM}$, and the differential input signal $V_{IN}^+ - V_{IN}^-$ is equal to $2 \times V_{SIG}$ because $V_{IN}^+$ is equal to $V_{CM} + V_{SIG}$ and $V_{IN}^-$ is equal to $V_{CM} - V_{SIG}$.

The common mode signal component $V_{CM}$ depends on the particular circuit or application that generates the differential input signal $V_{IN}^+ - V_{IN}^-$. It can be readily seen that the following relationships exist between $V_{IN}^+$, $V_{IN}^-$, $V_{SIG}$, and $V_{CM}$:

$$V_{IN}^+ = V_{CM} + V_{SIG}, \qquad \text{Eqn. (A)}$$

$$V_{IN}^- = V_{CM} - V_{SIG}, \text{ and} \qquad \text{Eqn. (B)}$$

$$V_{IN}^+ - V_{IN}^- = 2V_{SIG}. \qquad \text{Eqn. (C)}$$

Switches SW5 and SW6 connect summing conductors 13 and 14, respectively, to $V_{SS}$. $V_{IN}^+$ is sampled onto the bottom plate of capacitor C1 and onto the top plate of capacitor C2. Input voltage $V_{IN}^+$ includes the common mode voltage component $V_{CM}$ of the differential voltage $V_{IN}^+ - V_{IN}^-$. The input voltage of SAR ADC 10 can be thought of as the combination of the differential input voltage $V_{IN}^+ - V_{IN}^-$ with the common mode voltage $V_{CM}$. After sampling is finished, the sampled charge on the bottom plate of capacitor C1 is equal to ($V_{CM} + (V_{IN}^+ - V_{IN}^-)/2$) multiplied by C1.

Since a capacitor top plate and bottom plate have equal amounts of charge but with opposite polarity, the charge on the top plate of C1 is therefore equal to ($-V_{CM} - (V_{IN}^+ - V_{IN}^-)/2$) multiplied by C1. The total sampled charge will be held on the top plate of capacitor C1 after sampling is finished. $V_{IN}^-$ is sampled onto the top plate of capacitor C3. After sampling is complete, the charge held on the top plate of capacitor C3 is equal to ($V_{CM}$−($V_{IN}^{+}$−$V_{IN}^{-}$)) multiplied by C3. Only the "$V_{CM}$-induced" charges have opposite polarities, whereas the differential input voltage ($V_{IN}^{+}$−$V_{IN}^{-}$) charges have the same polarities. Therefore, on the top plates of capacitors C1 and C3, the $V_{CM}$-induced charges have opposite polarities, whereas the differential charges have the same polarities.

At the end of the sampling phase, the differential input signal $V_{IN}^{+}$, $V_{IN}^{-}$ has been sampled onto capacitors C1-C4 of FIG. 4, wherein the charges stored on the top and bottom plates of these capacitors are given by the following equations:

$$Q_{C1,top} = Q_{C2,bottom} = -CV_{IN}^{+} = -C(V_{CM}+V_{SIG}).\quad\text{Eqn. (1)}$$

This is because at the end of sampling phase, the sampled charge at the bottom plate of C1 is equal to $Q_{C1,bottom} = C1V_{IN}^{+}$. Since the top plate of C1 has same amount charge but opposite polarity as the bottom plate of C1, the top plate charge of C1 is $Q_{C1,top} = -Q_{C1,bottom} = -C1V_{IN}^{+}$. At the end of sampling phase, the sampled charge on the top plate of C2 is equal to $Q_{C2,top} = C2V_{IN}^{+}$. Since the top plate of C2 has same amount of charge but opposite polarity as the bottom plate of C2, the bottom plate charge of C2 is $Q_{C2,bottom} = -C2V_{IN}^{+}$. Since C1=C2=C3=C4=C, then $Q_{C1,top} = Q_{C2,bottom} = -CV_{IN}^{+}$.

$$Q_{C3,bottom} = Q_{C4,top} = -CV_{IN}^{-} = -C(V_{CM}-V_{SIG}).\quad\text{Eqn. (2)}$$

$$Q_{C1,bottom} = Q_{C2,top} = CV_{IN}^{+} = C(V_{CM}+V_{SIG}).\quad\text{Eqn. (3)}$$

$$Q_{C3,top} = Q_{C4,bottom} = CV_{IN}^{-} = C(V_{CM}-V_{SIG}).\quad\text{Eqn. (4)}$$

When sampling is complete, and just before SAR ADC 10 begins the first bit decision operation, capacitor C3 is switched from its connection shown in FIG. 4 to its connection to capacitor C1 in FIG. 5. Also, capacitor C2 is switched from its connection shown in FIG. 4 to its connection to capacitor C4 in FIG. 5.

After completion of the sampling operation, the top plates of capacitors C1 and C3 have been connected together and the top plates of capacitors C2 and C4 have been connected together as shown in FIG. 5, so the common mode charges have been canceled. Capacitors C1 and C3 function as a capacitive voltage divider causing the common mode voltage on conductor 13 to be equal to $V_{REF}/2$. Similarly, capacitors C1 and C3 also function as a capacitive voltage divider causing the common mode voltage on conductor 14 to be equal to $V_{REF}/2$. Consequently, as the subsequent bit testing process continues, the summing conductor voltages $V_{A}^{+}$ and $V_{A}^{-}$ remain within the safe range and settle to become essentially equal to $V_{REF}/2$.

Thus, in SAR ADC 10 of FIGS. 2 and 3 the comparator input common mode voltage is fixed, and therefore the voltages $V_{A}^{+}$ and $V_{A}^{-}$ on CDAC summing conductors 13 and 14, respectively, are always within between the supply voltage and ground so that no sampled charge is leaked through substrate diodes associated with the various CDAC switches. The present invention therefore makes it unnecessary to use the various prior art techniques for boosting the voltages of the summing node conductors at the input of the comparator during the SAR bit testing process.

This is in direct contrast to the SAR ADC shown in Prior Art FIG. 1B, in which the analog summing conductor of voltages at the input of the comparator vary substantially as a function of the common mode input voltage, and therefore typically would have values outside of the safe range between the supply voltage and ground voltage (thereby causing sampled charge to leak through integrated circuit substrate diodes), unless the prior art capacitive boosting technique and modified SAR algorithm are utilized.

More specifically, when SAR ADC 10 is switched from the sampling configuration shown in FIGS. 2 and 4 to the sampled charge holding configuration shown in FIGS. 3 and 5, the common mode charges will be averaged or canceled because of their opposite polarities, whereas the differential signal charges will be added because they have the same polarity. Furthermore, since in FIG. 5 the bottom plate of capacitor C1 is connected to $V_{REF}$, and the bottom plate of capacitor C3 is connected to ground, they function as a voltage divider to establish the common mode voltage component $V_{CM}$ of $V_{A}^{-}$ on conductor 13 equal to $V_{REF}/2$.

In FIG. 5, the charges stored on the top plates of capacitors C1 and C3 are summed together, and the charges stored on the top plate of capacitors C2 and C4 also are summed together. The charges on the top plates and bottom plates of the various capacitors coupled as shown in FIG. 5 are equal to:

$$Q_{C1,C3} = Q_{C1,top} + Q_{C3,top} = -2CV_{SIG},\text{ and}\quad\text{Eqn. (5)}$$

$$Q_{C2,C4} = Q_{C2,top} + Q_{C4,top} = 2CV_{SIG}.\quad\text{Eqn. (6)}$$

Thus, the charges corresponding to the initial input common-mode signal $V_{CM}$ in FIG. 5 are canceled, and only the differential charges corresponding to $V_{IN}^{+}$−$V_{IN}^{-}$ are converted to the digital output signal $D_{OUT}$. The common mode voltage components $V_{CM}$ of $V_{A}^{+}$ and $V_{A}^{-}$ on conductors 13 and 14, respectively, depend only on the reference voltage $V_{REF}$, and are equal to $V_{REF}/2$ since C1=C3 and C2=C4. The common mode voltage component $V_{CM}$ on CDAC summing conductors 13 and 14 has a fixed value of $V_{REF}/2$. Therefore, the subsequent SAR bit decisions are independent of the common mode voltage component $V_{CM}$ of differential signal $V_{IN}^{+}$−$V_{IN}^{-}$.

Soon after the sampled charge is being held or stored in SAR ADC 10 by the switches configured as shown in FIG. 4, comparator 20 generates an output which is used to decide whether bit 1 should be set to a "1" or a "0".

During testing of the first bit b1, the upper MSB capacitor C3 is connected to $V_{SS}$, and the remaining upper capacitors, i.e., the upper LSB capacitors C1 are connected to $V_{REF}$. Since C3=C1, these two capacitances function as a voltage divider, causing summing conductor voltage $V_{A}^{-}$ to be equal to $V_{REF}/2$. And similarly during testing of the first bit b1, the lower MSB capacitor C2 is connected to $V_{REF}$, and the remaining lower capacitors, i.e., the lower LSB capacitors C4 are connected to ground. Since C2=C4, these two capacitances function as a voltage divider, causing summing conductor voltage $V_{A}^{+}$ to be equal to $V_{REF}/2$.

In the fully-differential SAR ADC 10 example of FIGS. 2 and 3, MSB capacitors C3 and C2 are sampled on their top plates, and LSB capacitors C1 and C4 are sampled on their bottom plates. After sampling of the input voltage is complete and before the beginning of the first bit decision process, the top plate of MSB capacitor C3 is connected to the top plate of LSB capacitor C1 to cancel the input common mode voltage. Therefore, the upper CDAC 16 contains only differential input signal charge on the summing conductor 13 and its DC voltage is equal to $V_{REF}/2$ and is independent of the input common mode voltage $V_{CM}$. Also, after sampling of the input voltage is complete and before the beginning of the first bit decision process, the top plate of MSB capacitor C2 is connected to the top plate of LSB capacitor C4 to cancel the input common mode voltage. Therefore, lower CDAC 17 contains only differential input signal charge on summing conductor 14 and its DC voltage is equal to $V_{REF}/2$ and is independent of the input common mode voltage $V_{CM}$.

Consequently, the CDAC top plate voltages are always between the supply voltage $V_{REF}$ and ground, so the sampled charges can be reliably stored on the CDAC capacitors and are not subject to leakage reached through integrated circuit substrate diodes associated with the summing conductors 13 and 14.

Figure 7:
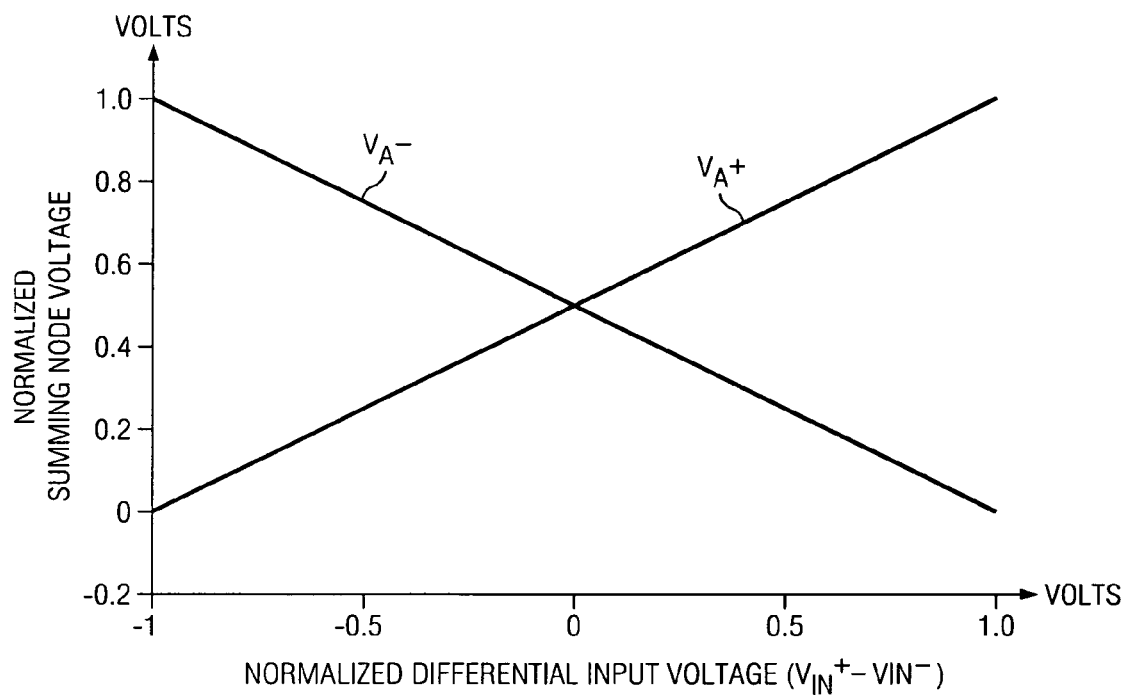
FIG. 7 is a graph illustrating the signals $V_A^+$ and $V_A^-$ as a function of differential input voltage in SAR ADC of FIGS. 2 and 3.

FIG. 7 illustrates the normalized voltages $V_A^+$ and $V_A^-$ on summing conductors 13 and 14, respectively, immediately after the input voltage sampling is complete (but before the bit 1 decision is made) as a function of the normalized differential input voltage $V_{IN}^+ - V_{IN}^-$. The graph in FIG. 7 shows that both $V_A^+$ and $V_A^-$ are always within the normalized voltage range of 0-1.0 volts, so problems associated with loss of sampled charge representing the differential input signal $V_{IN}^+ - V_{IN}^-$ due to charge leakage through integrated circuit substrate diodes are completely avoided.

Figure 8:
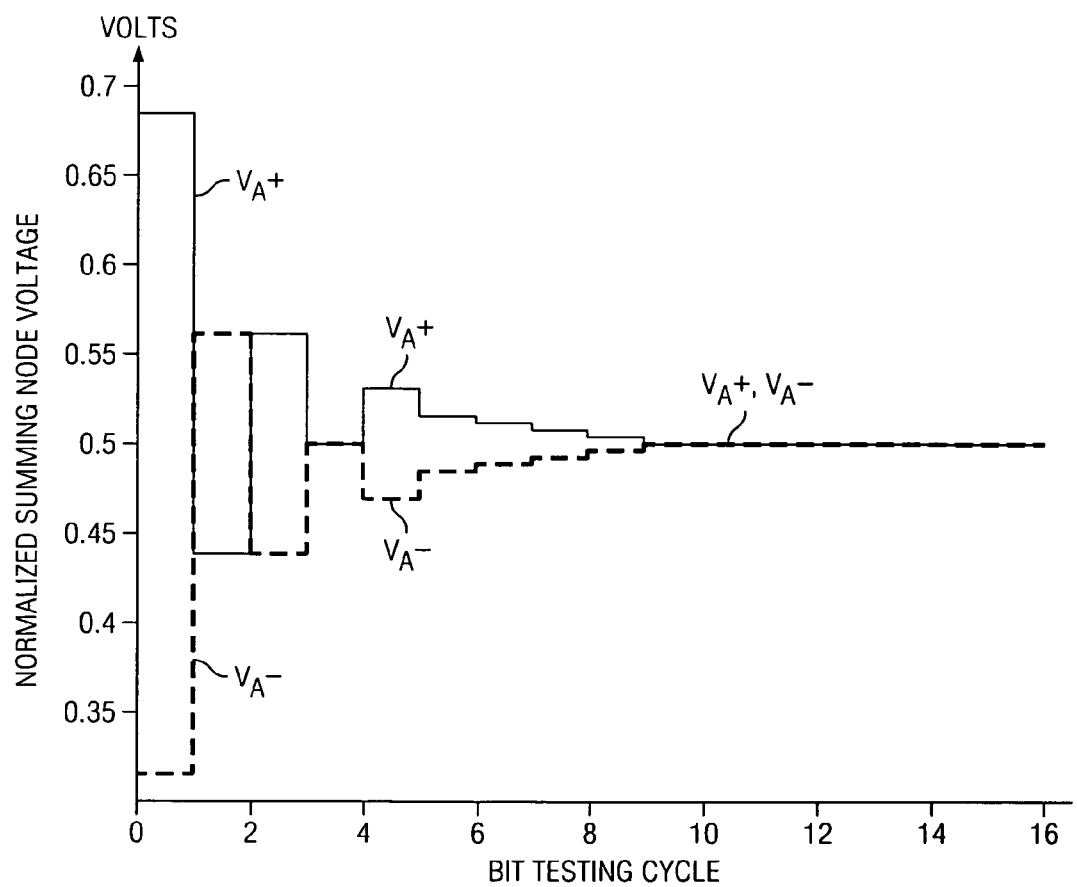
FIG. 8 is a graph illustrating the signals $V_A^+$ and $V_A^-$ as a function of the bit testing cycle in a 16 bit implementation of the SAR ADC of FIGS. 2 and 3.

The graph of FIG. 8 illustrates normalized values of summing node voltages $V_A^+$ and $V_A^-$ during each of the 16 SAR bit testing operations (for a 16 bit implementation of SAR ADC 10). At the beginning of the conversion process, the summing node voltages $V_A^+$ and $V_A^-$ are within the "safe region" (in which no sampled charge leakage through a substrate diode can occur) and converge to the normalized common mode reference voltage $V_{REF}/2$ as the SAR bit testing progresses. Since $V_A^+$ and $V_A^-$ remain in the safe region until the summing node voltages $V_A^+$ and $V_A^-$ converge, there is never any danger of sampled charge leakage to the substrate that would cause bit decision errors.

In SAR ADC 10, the summing conductor common mode voltage Vcm,cmp (which is given by the expression Vcm,cmp=$(V_A^+ + V_A^-)/2$) on both summing conductors 13 and 14 is independent of the ADC input signal common mode voltage (given by the expression $V_{CM} = (V_{IN}^+ + V_{IN}^-)/2$), since Vcm,cmp is always equal to the optimum value $V_{REF}/2$ and therefore remains unchanged through each bit testing and conversion cycle. That value of Vcm,cmp provides a maximum ADC input signal range without any resulting charge leakage through a substrate junction diode. This is in direct contrast to the closest prior art, in which the summing conductor common mode voltage Vcm,cmp is strongly related to Vcm and will undergo large changes during each bit testing and conversion cycle.

It should be understood that although FIGS. 2 and 3 illustrate a fully differential ADC, the invention is also applicable to a pseudo-differential ADC, wherein one of the inputs, $V_{IN}^-$ for example, remains at a fixed voltage that typically is close to or equal to ground voltage. Furthermore, the $V_{IN}^-$ input could be connected to ground internally in a single-ended ADC that otherwise is the same as the above mentioned pseudo-differential ADC.

Furthermore, it also should be understood that only a single CDAC is required. For example, in FIG. 2 CDAC 17 could be omitted, and the (+) input of comparator 20 instead could be connected to a reference voltage equal to $V_{REF}/2$. In this case, $V_{IN}^+$ would be sampled onto the bottom plates of the LSB capacitors represented by C1 (i.e., capacitors 29-2, 3 . . . N, 26), and $V_{IN}^-$ would be sampled onto the top plate of MSB capacitor C3. During the holding phase, switch SW3 would be closed to connect the top plates of C1 and C3 together, and the bottom plates of the LSB capacitors represented by C1 would be switched to $V_{REF}$ and the bottom plate of MSB capacitor C3 would be connected to ground. This would result in cancellation of the input common mode voltage component from summing conductor 13 and provide a $V_{REF}/2$ common mode voltage on conductors 13 and 14.

To summarize, the common mode voltage signal components and associated common mode charge in SAR ADC 10 are automatically canceled and a fixed common mode voltage equal to $V_{REF}/2$ is automatically established, by a voltage divider coupled between $V_{REF}$ and ground, on the summing conductors connected to the inputs of the SAR comparator. That common mode voltage component is independent of the common mode component of the SAR ADC input voltage. This completely prevents out-of-range or unsafe summing conductor voltages.

Consequently, SAR ADC 10 avoids the need for the additional boost capacitors which are required by the prior art to boost the input common mode voltage at the inputs of the SAR comparator. SAR ADC 10 also avoids the need for corresponding modifications of the SAR algorithm which are required by the prior art to accommodate the boosting operation of the boosting capacitors. SAR ADC 10 also avoids the reduction in SNR (signal to noise ratio) caused by the boost capacitors. The benefits of SAR ADC 10 over the closest prior art include a reduced amount of required integrated circuit chip area, simpler circuitry, and reduced sampling power.

Figure 9:
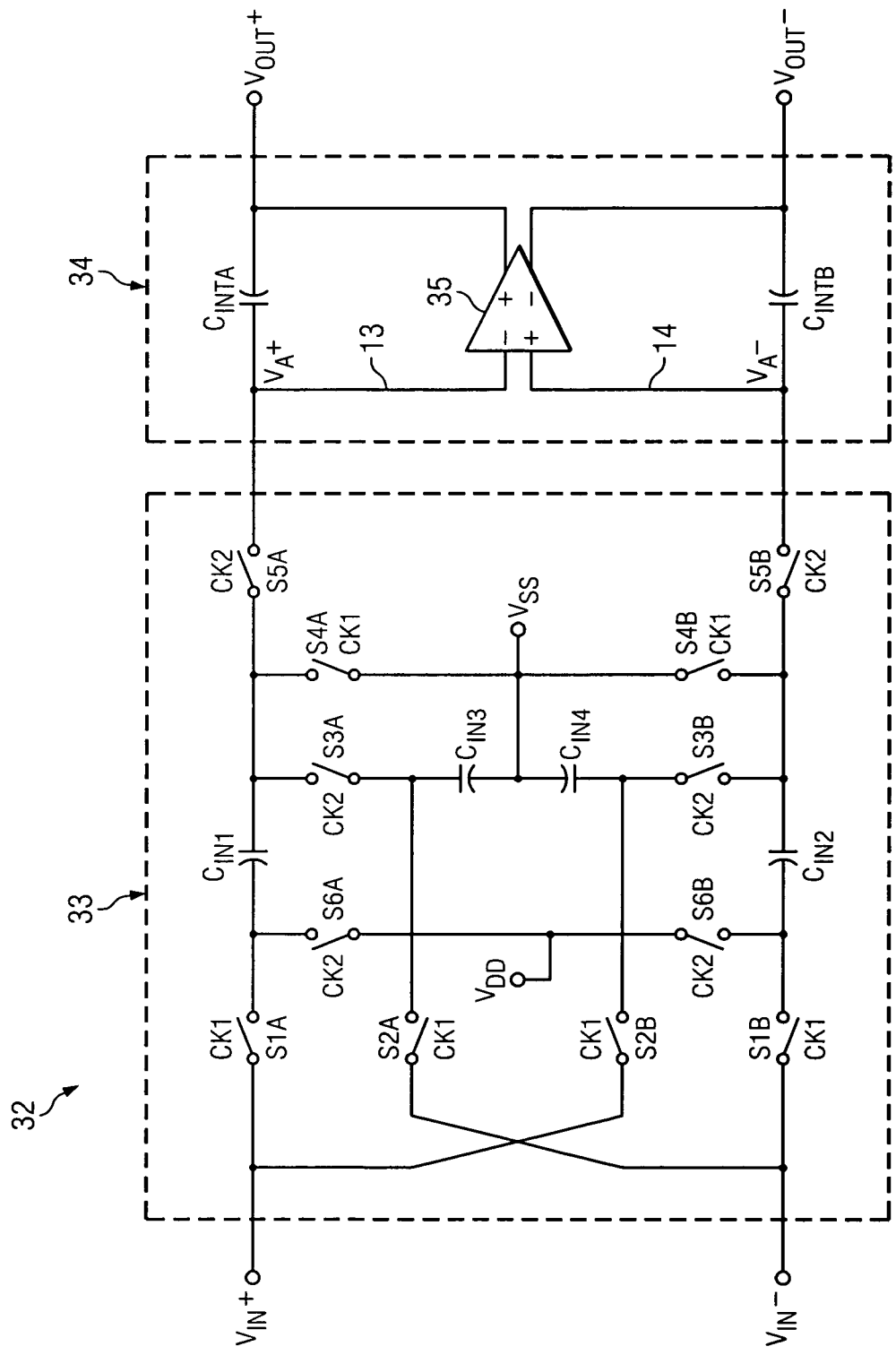
FIG. 9 is a schematic diagram of a zero-power sampling switched-capacitor integrator circuit embodiment of the present invention.
Figure 10:
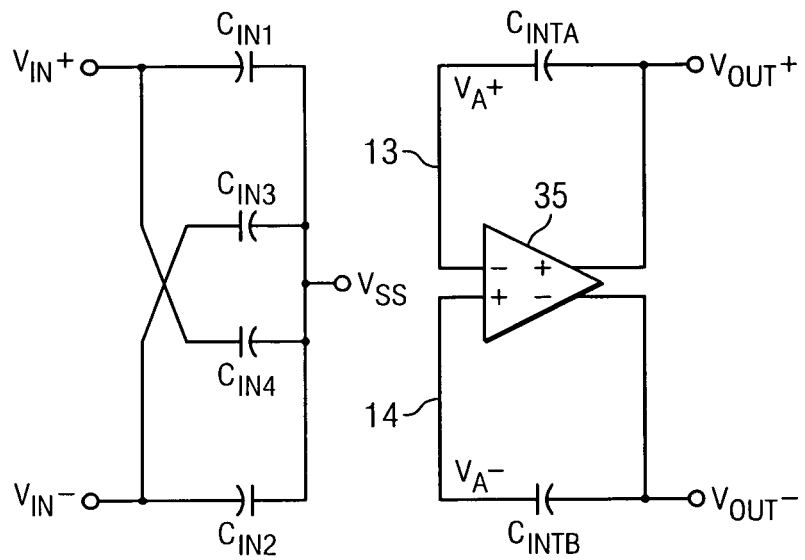
FIG. 10 is a schematic diagram for illustrating and analyzing the zero-power sampling technique of the switched-capacitor integrator circuit of FIG. 9.
Figure 11:
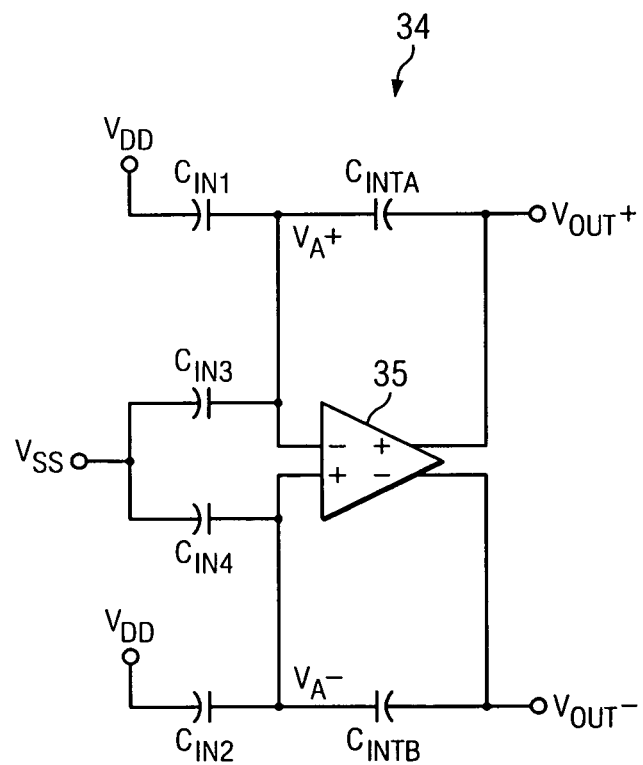
FIG. 11 is a simplified schematic diagram for illustrating and analyzing charge transfers during integration operation of the switched-capacitor integrator circuit of FIG. 9.

FIG. 9 shows another embodiment of the invention which includes a zero-power sampling switched-capacitor integrator circuit 32. FIG. 10 shows a simplified diagram for illustrating and analyzing the zero-power sampling, and FIG. 11 shows a simplified diagram for illustrating and analyzing charges during integration operation.

In FIG. 9, switched-capacitor integrator circuit 32 includes switched-capacitor circuitry 33 which receives an input signal $V_{IN}^+ - V_{IN}^-$ and generates voltages $V_A^+$ and $V_A^-$ on summing conductors 13 and 14, respectively. Summing conductor 13 is connected to the (−) input of an integrator 35 and to the top plate of an integrating capacitor $C_{INTA}$, the bottom plate of which is connected to a (+) output of integrator 35. Summing conductor 14 is connected to the (+) input of integrator 35 and to the top plate of an integrating capacitor $C_{INTB}$, the bottom plate of which is connected to a (−) output of integrator 35. An integrator output voltage $V_{OUT}^+ - V_{OUT}^-$ is generated between the (+) and (−) outputs of integrator 35.

Switched-capacitor circuitry 33 in FIG. 9 includes switches S1A and S2B each having one terminal coupled to $V_{IN}^+$, and also includes switches S1B and S2A each having one terminal coupled to $V_{IN}^-$. Switch S1A has a second terminal connected to the bottom plate of an input or sampling capacitor $C_{IN1}$ and one terminal of a switch S6A having another terminal connected to $V_{DD}$. Switch S1B has a second terminal connected to the bottom plate of an input or sampling capacitor $C_{IN2}$ and one terminal of a switch S6B having another terminal connected to $V_{DD}$. Input capacitor $C_{IN1}$ has a top plate connected to one terminal of a switch S3A, one terminal of a switch S4A, and one terminal of a switch S5A. Input capacitor $C_{IN2}$ has a top plate connected to one terminal of a switch S3B, one terminal of a switch S4B, and one terminal of a switch S5B. The other terminal of switch S3A is connected to the other terminal of switch S2A and the top plate of an input or sampling capacitor $C_{IN3}$, the bottom plate of which is connected to $V_{SS}$. The other terminal of switch S3B is connected to the other terminal of switch S2B and the top plate of an input or sampling capacitor $C_{IN4}$, the bottom plate of which is connected to $V_{SS}$. The other terminals of switches S4A and S4B are connected to $V_{SS}$. The other terminal of switch S5A is connected to summing conductor 13, and the other terminal of switch S5B is connected to summing conductor 14.

CK1 and CK2 are complementary, non-overlapping clock signals. Switches S1A, S1B, S2A, S2B, S4A, and S4B are controlled by CK1, and switches S3A, S3B, S6A, S6B, S5A, and S5B are controlled by CK2. (Note that a slightly delayed version of CK1 may instead be used to control switches S1A and S1B.)

In FIG. 9, the charges on integrating capacitors $C_{INTA}$ and $C_{INTB}$ are stored or "held" when switches S5A and S5B are open, i.e., during the sampling phase.

When switched capacitor integrator circuit 32 is in its sampling phase as shown in FIG. 10, CK1 is a logical "1" so S1A, S1B, S2A, S2B, S4A, and S4B are closed. Then the top plate of $C_{IN1}$, the bottom plate of $C_{IN3}$, the top plate of $C_{IN2}$, and the bottom plate of $C_{IN4}$ are connected to ground. Also, $V_{IN}^+$ is connected to the bottom plate of $C_{IN1}$ and the top plate of $C_{IN4}$, and $V_{IN}^-$ is connected to the bottom plate of $C_{IN2}$ and the top plate of $C_{IN3}$. Therefore, both the differential input information and the common mode input information associated with differential input signal $V_{IN}^+ - V_{IN}^-$ are sampled. Ideally, all four of input capacitors $C_{IN1}$, $C_{IN2}$, $C_{IN3}$, and $C_{IN4}$ are equal. Integration capacitors $C_{INTA}$ and $C_{INTB}$ provide negative feedback for integrator 35 so as to cause integration capacitors $C_{INTA}$ and $C_{INTB}$ hold the charge from the previous cycle.

After the sampling illustrated in FIG. 10 is finished, operation of switched capacitor integrator circuit 32 then switches to an integration operation in which $C_{IN3}$ and $C_{IN2}$ are connected as shown in FIG. 11. This results in cancellation of the common mode charge component from conductor 13 when the bottom plate of $C_{IN1}$ is coupled to $V_{DD}$ and the bottom plate of $C_{IN3}$ is coupled to $V_{SS}$. That also sets the common mode voltage on summing conductor 13 to $V_{DD}/2$. Operation is similar for establishing the common mode voltage equal to $V_{DD}/2$ on summing conductor 14. The differential signal charge associated with $V_{IN}^+$ is transferred from $C_{IN1}$ and $C_{IN3}$ to integration capacitor $C_{INTA}$ and changes output voltage $V_{OUT}^+$, and the differential signal charge associated with $V_{IN}^-$ is transferred from $C_{IN2}$ and $C_{IN4}$ to integration capacitor $C_{INTB}$ and changes output voltage $V_{OUT}^-$, to finish the present integration phase.

Thus, the differential charge is transferred to the integration capacitors $C_{INTA}$ and $C_{INTB}$ and provides the differential charges that determine the values of $V_{OUT}^+$ and $V_{OUT}^-$, and the common mode voltage has been canceled with no effect on the differential output voltage $V_{OUT}^+ - V_{OUT}^-$. After each integration phase, switched capacitor integrator circuit 32 goes back into its sampling mode, and the new values of $V_{OUT}^+$ and $V_{OUT}^-$ are held or maintained until the next integrating phase.

Figure 12:
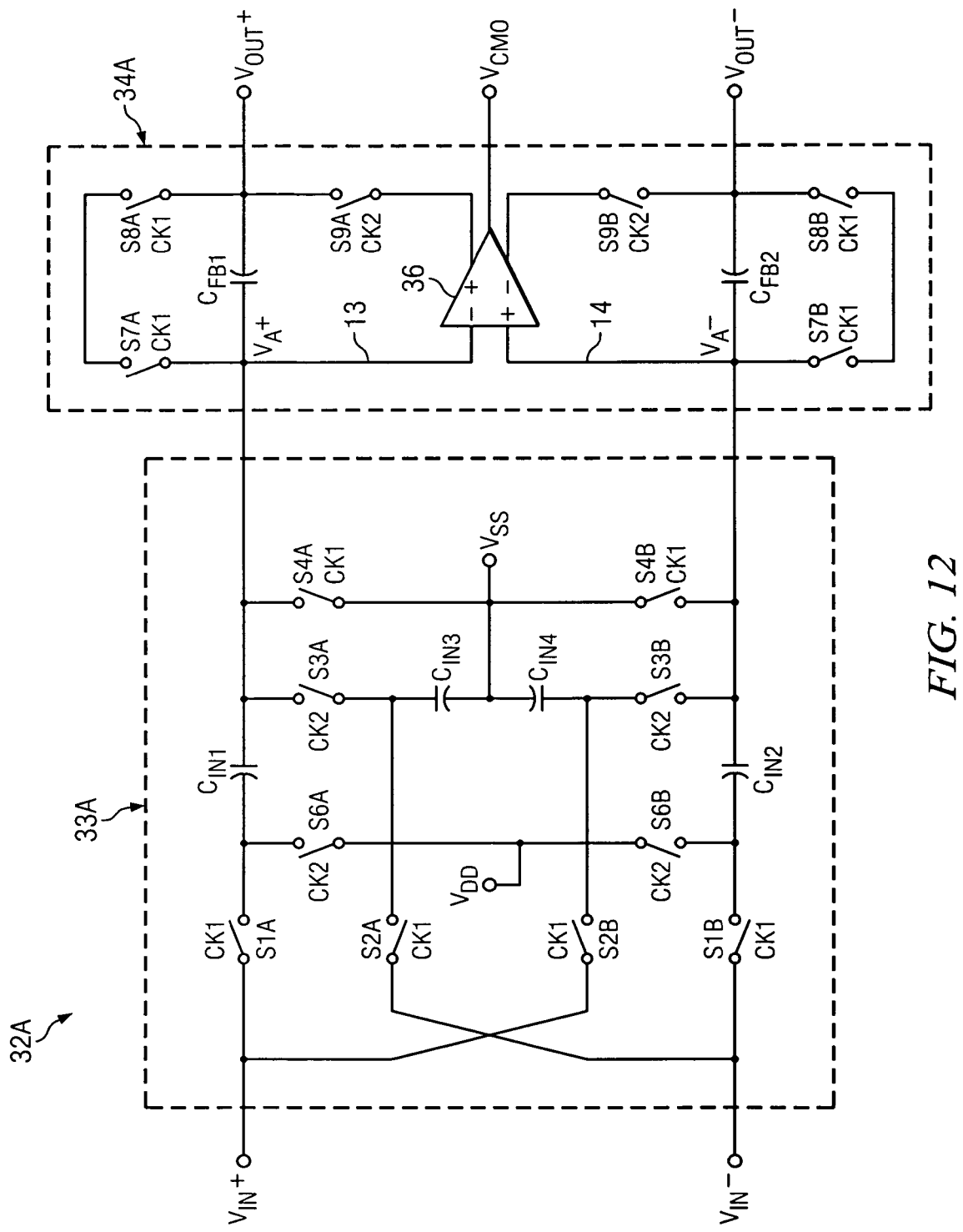
FIG. 12 is a simplified schematic diagram of a zero-power sampling switched-capacitor amplifier embodiment of the present invention.

FIG. 12 is a simplified schematic diagram of a zero-power sampling switched-capacitor amplifier embodiment of the present invention. In FIG. 12, switched-capacitor amplifier 32A includes switched-capacitor circuitry 33A, which can be the same as in FIG. 9 except that switches S5A and S5B are omitted. Switched-capacitor amplifier circuit 32A includes an amplifier 36, rather than integrator 35 in FIG. 9, having its (−) input connected by summing conductor 13 to the top plate of capacitor $C_{IN1}$ and its (+) input connected by summing conductor 14 to the top plate of capacitor $C_{IN2}$.

The (−) input of amplifier 36 also is connected to the top plate of a feedback capacitor $C_{FB1}$ and to one terminal of a switch S7A. (By way of definition, comparator 20 in FIGS. 2 and 3, integrator 35 in FIG. 9, and an amplifier 36 in FIG. 12 are considered to be "processing" circuits.) The bottom plate of feedback capacitor $C_{FB1}$ is connected to one terminal of each of switches S8A and S9A. The other terminal of switch S8A is connected to the other terminal of switch S7A, and the other terminal of switch S9A is connected to the (+) output of amplifier 36, which generates the output voltage $V_{OUT}^+$. Similarly, the (+) input of amplifier 36 also is connected to the top plate of a feedback capacitor $C_{FB2}$ and to one terminal of a switch S7B. The bottom plate of feedback capacitor $C_{FB2}$ is connected to one terminal of each of switches S8B and S9B. The other terminal of switch S8B is connected to the other terminal of switch S7B, and the other terminal of switch S9B is connected to the (−) output of amplifier 36, which generates the output voltage $V_{OUT}^-$. Clock signals CK1 and CK2 are the same as in FIG. 9, and control the same switches in switched capacitor circuitry 33A in FIG. 12 as in switched-capacitor circuitry 33 in FIG. 9. In FIG. 12, clock signal CK1 also controls switches S7A, S7B, S8A, and S8B and clock signal CK2 also controls switches S9A and S9B. Operation of switched-capacitor circuitry 33A to cancel input common mode signal components and establish fixed common mode signal levels on conductors 13 and 14 is essentially the same as in FIG. 9.

It should be understood that switched-capacitor circuitry essentially similar to switched-capacitor circuitry 33 in FIG. 9 also can be used in a delta sigma modulator or delta sigma ADC.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although the embodiment of the invention shown in FIGS. 2 and 3 switches the connections of the MSB capacitors C3 and C2 from the configuration shown in FIG. 4 to the configuration shown in FIG. 5, with capacitors C1, C2, C3, and C4 ideally equal in order to achieve complete cancellation of the effects of the common mode input voltage component and simultaneously establish a fixed common mode voltage $V_{REF}/2$ on each of the summing conductors 13 and 14, suitable results may be achieved in some cases by switching one of the LSB capacitors along with and in exactly the same way as the corresponding MSB capacitor. This would provide less than complete cancellation of the common mode input voltage component and also would result in the common mode voltage established on the summing conductors 13 and 14 to being different than $V_{REF}/2$. This could be accomplished in such a way that the summing conductor voltages $V_A^+$ and $V_A^-$ nevertheless would remain within a predetermined safe operating voltage range.

What is claimed is:

1. A switched-capacitor circuit comprising:
   (a) a first stage receiving first and second input signals and including first, second, third, and fourth input capacitors and also including
   a first arrangement of switches configured, during a first phase, to couple
   i) the first input signal to a bottom plate of the first input capacitor and a top plate of the fourth input capacitor,
   ii) the second input signal to a bottom plate of the second input capacitor and a top plate of the third input capacitor, and
   iii) top plates of the first and second input capacitors to a first reference voltage,
   iv) bottom plates of the third and fourth input capacitors to the first supply voltage, the first and second input signals thereby being sampled during the first phase;
   (b) a second stage having first and second summing conductors coupled to the first stage for processing a first summing conductor signal and a second summing conductor signal to produce first and second output signals;

(c) the first stage also including a second arrangement of switches configured, during a second phase, to couple:
  i) the bottom plates of the first and second input capacitors to a second reference voltage,
  ii) the top plate of the first input capacitor to the top plate of the third input capacitor and
  iii) the top plate of the second input capacitor to the top plate of the fourth input capacitor to:
     cancel at least a portion of a common mode component associated with the first and second input signals from the first and second summing conductor signals and
     establish a predetermined common mode voltage on the first and second summing conductors
     so as to keep the first and second summing conductor signals within a predetermined safe operating range as charge associated with the first input signal is transferred from the first and third input capacitors to the first summing conductor and charge associated with the second input signal is transferred from the fourth and second input capacitors to the second summing conductor.

2. The switched-capacitor circuit of claim 1 including a SAR ADC that includes
  (1) a comparator in the second stage for comparing the first summing conductor signal and the second summing conductor signal during each of a number of bit testing operations;
  (2) a first CDAC in the first stage including a first group of binary weighted capacitors including a MSB capacitor and a plurality of LSB capacitors each having a first terminal coupled to the first summing conductor, and a first group of switches for selectively coupling second terminals of corresponding capacitors of the first group to the first reference voltage or the second reference voltage, the second terminals of the LSB capacitors of the first group being selectively coupled to the first input signal during the sampling;
  (3) SAR and control circuitry for controlling the switches of the first group in response to output signals generated by the comparator; and
  (4) wherein, after the sampling is complete and before testing of a first bit, the SAR and control circuitry controls the switches of the first group to connect second terminals of the MSB capacitor and the LSB capacitors of the first group in series between the first and second reference voltages to function as a capacitive voltage divider that generates the predetermined common mode voltage signal component on the first summing conductor.

3. The switched-capacitor circuit of claim 2 including a first switch which couples the first summing conductor to the first reference voltage during the sampling operation.

4. The switched-capacitor circuit of claim 3 wherein the first CDAC includes a second switch which couples the first summing conductor to the first terminal of the MSB capacitor during a charge holding operation after the sampling and before the testing of the first bit.

5. The switched-capacitor circuit of claim 4 including a second CDAC including a second group of binary weighted capacitors including a MSB capacitor and a plurality of LSB capacitors each having a first terminal coupled to produce a second signal on a second summing conductor and a second group of switches for selectively coupling corresponding capacitors of the second group to the first reference voltage or the second reference voltage, the second terminal of the LSB capacitors of the second group being coupled to a second input signal during the sampling, wherein the first terminal of the MSB capacitor of the first group is coupled to receive the first input signal during the sampling, and wherein the first terminal of the MSB capacitor of the second group is coupled to receive the second input signal during the sampling.

6. The switched-capacitor circuit of claim 4 wherein the charge holding operation is performed by means of the MSB capacitor and the LSB capacitors of the first group.

7. The switched-capacitor circuit of claim 4 wherein a first switch of the first group couples the second terminal of the MSB capacitor of the first group to the first reference voltage during the sampling and other switches of the first group couple the second terminals of the LSB capacitors, respectively, of the first group to the first input signal during the sampling.

8. The switched-capacitor circuit of claim 7 wherein the first switch of the first group couples the second terminal of the MSB capacitor to the first reference voltage during the charge holding operation and other switches of the first group couple the second terminals of the LSB capacitors, respectively, of the first group to the second reference voltage during the charge holding operation.

9. The switched-capacitor circuit of claim 2 wherein the first and second signals remain between the first and second reference voltages during all bit testing operations and converge toward the predetermined common mode voltage signal component as the bit testing proceeds.

10. The switched-capacitor circuit of claim 2 wherein the common mode voltage signal component on the first summing conductor has a voltage midway between the first and second reference voltages.

11. The switched-capacitor circuit of claim 2 wherein the bit testing operations are performed in response to the comparator and the SAR and control circuitry in accordance with a SAR algorithm.

12. The switched-capacitor circuit of claim 1 including first and second integrated circuit substrate diodes coupled to the first and second summing conductors, respectively.

13. The switched capacitor circuit of claim 1 including a switched-capacitor integrator circuit that includes an integrator, a first integrating capacitor, and a second integrating capacitor in the second stage.

14. The switched capacitor circuit of claim 1 including a switched-capacitor amplifier circuit that includes an amplifier in the second stage.

15. The switched-capacitor circuit of claim 2 wherein the SAR ADC is a differential analog to digital converter.

16. A method for preventing leakage of differential input charge which has been sampled from a differential input signal that is equal to the difference between first and second input signals, the method comprising:
  (a) sampling the first input signal onto a first capacitor by switching a first terminal of the first capacitor through a first conductor to a first reference voltage, and switching a second terminal of the first capacitor to the first input signal;
  (b) sampling the second input signal onto a second capacitor by switching a first terminal of the second capacitor to the second input signal and switching a second terminal of the second capacitor to the first reference voltage;
  (c) after the sampling is complete, decoupling the first conductor from the first reference voltage; and
  (d) switching the first terminal of the second capacitor to the first conductor to couple the first terminal of the second capacitor to the first terminal of the first capacitor, switching the second terminal of the second capacitor to the first reference voltage, and switching the second terminal of the first capacitor to a second reference voltage, to thereby cancel at least a portion of a common mode input voltage component from the first conductor, hold the sampled differential charge on the first conductor, establish a predetermined common mode voltage component on the first conductor, and prevent the voltage of the first conductor from having a value which allows the leakage to occur.

17. The method of claim 16 including converting the difference between the first input signal and the second input signal to a digital signal,
    wherein step (a) includes sampling the first input signal onto each of a first group of binary weighted LSB capacitors by switching first terminals of the binary weighted LSB capacitors of the first group through a first summing conductor to a first reference voltage, and switching second terminals of the binary weighted LSB capacitors of the first group to the first input signal, wherein the first group of binary weighted LSB capacitors is included in the first capacitor;
    wherein step (b) includes switching a second terminal of a first MSB capacitor to the first reference voltage and switching a first terminal of the first MSB capacitor to the second input signal, wherein the first MSB capacitor is included in the second capacitor, the first conductor being connected to a first input of a comparator;
    wherein step (c) includes decoupling the first conductor from the first reference voltage before testing of a first bit; and
    wherein step (d) includes switching the first terminal of the first MSB capacitor to the first conductor to thereby couple the first terminal of the first MSB capacitor to the first terminals of the binary weighted LSB capacitors of the first group, switching the second terminal of the first MSB capacitor to the first reference voltage, and switching the second terminals of the first group of LSB capacitors to a second reference voltage;
    the method further including producing the digital signal by operating the comparator and various switches in accordance with a SAR algorithm to test and set successive bits of the digital signal that correspond, respectively, to the first MSB capacitor and the first group of LSB capacitors.

18. The method of claim 17 including coupling a second input of the comparator to a reference voltage that is midway between the first and second reference voltages.

19. The method of claim 17 wherein step (a) includes sampling the second input signal onto a first terminal of each of a second group of binary weighted LSB capacitors by switching first terminals of the binary weighted LSB capacitors of the second group through a second conductor to the first reference voltage, and switching second terminals of the binary weighted LSB capacitors of the second group to the second input signal, and wherein step (a) also includes sampling the first input signal onto a second terminal of a second MSB capacitor by switching a first terminal of the second MSB capacitor to the first input signal, and switching a second terminal of the second MSB capacitor to the first reference voltage;
    and wherein step (b) includes switching the second terminals of the second group of LSB capacitors to the first reference voltage, switching the first terminal of the second MSB capacitor to the second conductor and switching the second terminal of the second MSB capacitor to the second reference voltage.

20. The method of claim 19 wherein step (d) includes operating the first MSB capacitor and the first group of LSB capacitors as a capacitive voltage divider to generate the predetermined common mode voltage signal component on the first summing conductor.

21. The method of claim 17 including providing a dummy capacitor having the same capacitance as the least significant of the LSB capacitors.

22. A switched-capacitor circuit for converting the difference between first and second input signals to a digital signal so as to prevent leakage of sampled input charge, comprising:
    (a) means input signal onto a first capacitor by switching a first terminal of the first capacitor through a first conductor to a first reference voltage, and switching a second terminal of the first capacitor to the first input signal;
    (b) means for sampling the second input signal onto a second capacitor by switching a first terminal of the second capacitor to the second input signal and switching a second terminal of the second capacitor to the first reference voltage; and
    (c) means for coupling the first terminal of the second capacitor to the first conductor to couple the first terminal of the second capacitor to the first terminal of the first capacitor, coupling the second terminal of the second capacitor to the first reference voltage, and coupling the second terminal of the first capacitor to a second reference voltage, to thereby cancel at least a portion of a common mode input voltage component from the first conductor, hold the sampled differential charge on the first conductor, establish a predetermined common mode voltage component on the first conductor, and prevent the voltage of the first conductor from having a value which allows the leakage to occur.

* * * * *